(12) United States Patent
Minato

(10) Patent No.: US 12,389,717 B2
(45) Date of Patent: Aug. 12, 2025

(54) SEMICONDUCTOR LIGHT EMITTING ELEMENT AND METHOD OF MANUFACTURING SEMICONDUCTOR LIGHT EMITTING ELEMENT

(71) Applicant: NICHIA CORPORATION, Anan (JP)

(72) Inventor: Shunsuke Minato, Anan (JP)

(73) Assignee: NICHIA CORPORATION, Anan (JP)

( * ) Notice: Subject to any disclaimer, the term of this patent is extended or adjusted under 35 U.S.C. 154(b) by 696 days.

(21) Appl. No.: 17/680,158

(22) Filed: Feb. 24, 2022

(65) Prior Publication Data

US 2022/0278250 A1 Sep. 1, 2022

(30) Foreign Application Priority Data

Feb. 26, 2021 (JP) .................................. 2021-030533
Jan. 31, 2022 (JP) .................................. 2022-013448

(51) Int. Cl.
| | | |
|---|---|---|
| *H10H 20/81* | (2025.01) | |
| *H10H 20/01* | (2025.01) | |
| *H10H 20/80* | (2025.01) | |
| *H10H 20/812* | (2025.01) | |
| *H10H 20/813* | (2025.01) | |
| *H10H 20/818* | (2025.01) | |
| *H10H 20/825* | (2025.01) | |

(52) U.S. Cl.
CPC .. *H10H 20/8215* (2025.01); *H10H 20/01335* (2025.01); *H10H 20/01* (2025.01); *H10H 20/018* (2025.01); *H10H 20/812* (2025.01); *H10H 20/813* (2025.01); *H10H 20/818* (2025.01); *H10H 20/8252* (2025.01); *H10H 20/882* (2025.01)

(58) Field of Classification Search
CPC . H01L 33/025; H01L 33/007; H01L 33/0093; H01L 33/0095; H01L 33/06; H01L 33/08; H01L 33/18; H01L 33/325
See application file for complete search history.

(56) References Cited

U.S. PATENT DOCUMENTS

| | | |
|---|---|---|
| 2006/0043392 A1 | 3/2006 | Kurahashi et al. |
| 2006/0202215 A1 | 9/2006 | Wierer et al. |
| 2010/0295075 A1 | 11/2010 | Smith et al. |
| 2011/0031633 A1* | 2/2011 | Hsu .................. H01L 25/50 257/E21.585 |
| 2018/0182914 A1 | 6/2018 | Okuno |

(Continued)

FOREIGN PATENT DOCUMENTS

| | | |
|---|---|---|
| JP | 2000-340882 A | 12/2000 |
| JP | 2006-066518 A | 3/2006 |

(Continued)

*Primary Examiner* — Christine A Enad
(74) *Attorney, Agent, or Firm* — Foley & Lardner LLP

(57) ABSTRACT

A semiconductor light emitting element includes: a first light emitting part comprising: a first n-side nitride semiconductor layer; a first active layer located on the first n-side nitride semiconductor layer; and a first p-side nitride semiconductor layer located on the first active layer; and a second n-side nitride semiconductor layer. A bonding face of the first light emitting part and a bonding face of the second n-side nitride semiconductor layer are directly bonded. At least one void is present between the bonding face of the first light emitting part and the bonding face of the second n-side nitride semiconductor layer.

8 Claims, 30 Drawing Sheets

(56) References Cited

U.S. PATENT DOCUMENTS

2019/0189596 A1* 6/2019 Chae .................. H01L 33/08
2020/0402964 A1* 12/2020 Kim .................. H01L 25/0756
2021/0184076 A1* 6/2021 Kim .................. H01L 33/325

FOREIGN PATENT DOCUMENTS

| JP | 2007-005419 A | 1/2007 |
| JP | 2011-507272 A | 3/2011 |
| JP | 2018-110173 A | 7/2018 |

\* cited by examiner

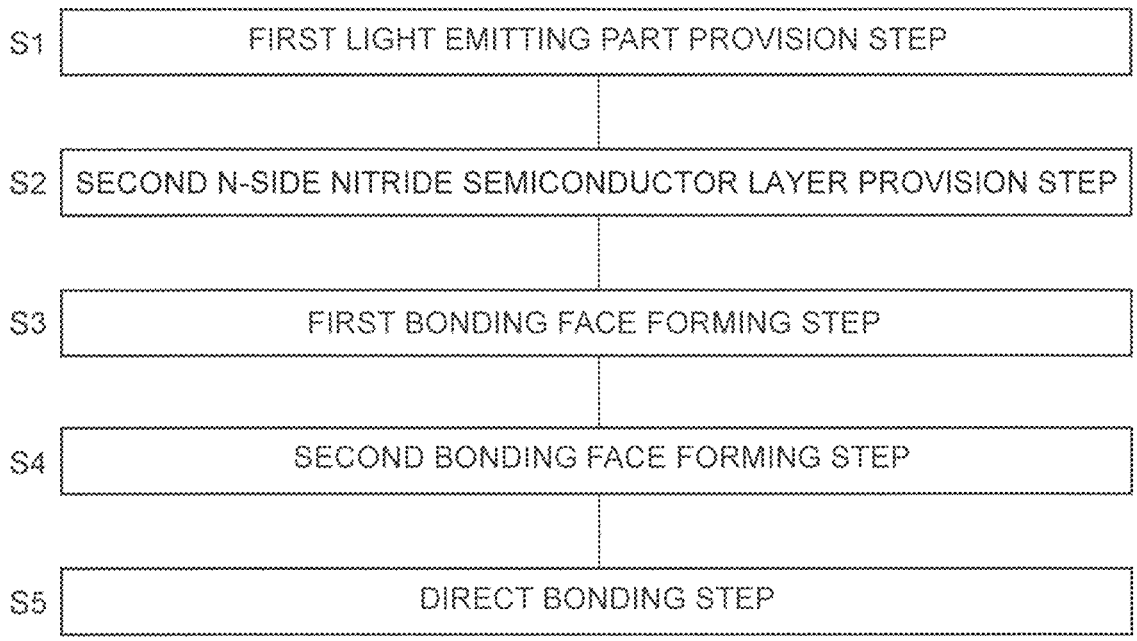

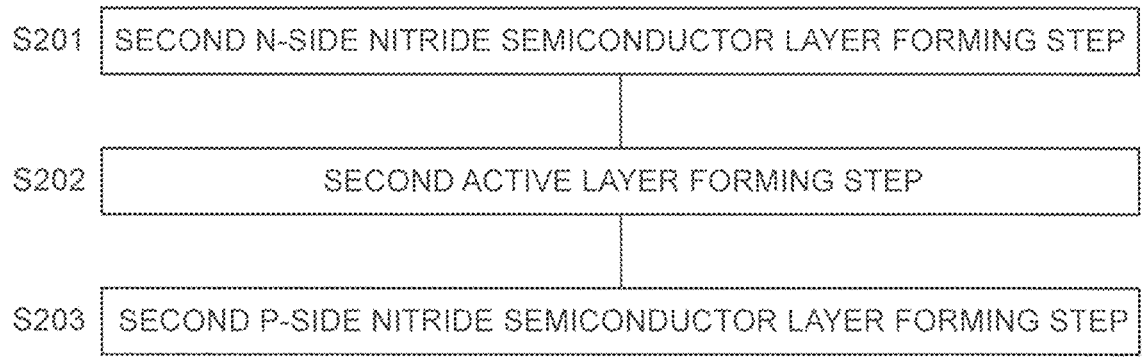

SEMICONDUCTOR LIGHT EMITTING ELEMENT AND METHOD OF MANUFACTURING SEMICONDUCTOR LIGHT EMITTING ELEMENT

CROSS-REFERENCE TO RELATED APPLICATIONS

This application claims priority to Japanese Patent Application No. 2021-030533, filed on Feb. 26, 2021, and Japanese Patent Application No. 2022-013448, filed on Jan. 31, 2022, the disclosures of which are hereby incorporated by reference in their entireties.

BACKGROUND

The present disclosure relates to a semiconductor light emitting element and a method of manufacturing the semiconductor light emitting element.

In order to increase the light emission efficiency of a semiconductor light emitting element, it is necessary to not only allow the light emitting element to efficiently emit light, but also efficiently extract the light emitted by the light emitting layers. See, for example, Japanese Patent Publication No. 2018-110173.

There is a need to further improve the light extraction efficiency of semiconductor light emitting elements as their applications expand.

One of the objects of the present disclosure is to provide a semiconductor light emitting element having increased light extraction efficiency, and a method of manufacturing such a semiconductor light emitting element.

According to one embodiment of the present disclosure, a semiconductor light emitting element includes: a first light emitting part that includes a first n-side nitride semiconductor layer, a first active layer located on the first n-side nitride semiconductor layer, and a first p-side nitride semiconductor layer located on the first active layer; and a second n-side semiconductor layer. A first bonding face of the first light emitting part and a second bonding face of the second n-side nitride semiconductor layer are directly bonded. At least one void is present between the first bonding face of the first light emitting part and the second bonding face of the second n-side nitride semiconductor layer.

Furthermore, according to another embodiment of the present disclosure, a method of manufacturing a semiconductor light emitting element includes: providing a first light emitting part that comprises a first active layer; providing a first semiconductor layer; forming a first bonding face comprising a first crystal plane by either one of subjecting a first principal face of the first light emitting part to an acidic or alkaline solution treatment, or polishing the first principal face of the first light emitting part; forming a second bonding face comprising a second crystal plane having a plane orientation different from a plane orientation of the first crystal plane by the other one of subjecting a second principal face of the first semiconductor layer to an acidic or alkaline solution treatment, or polishing the second principal face of the first semiconductor layer; and directly bonding the first bonding face and the second bonding face.

According to a semiconductor light emitting element of the present disclosure as constructed above, the light extraction efficiency of the semiconductor light emitting element can be increased.

Furthermore, according to a method of manufacturing a semiconductor light emitting element of the present disclosure, a semiconductor light emitting element having the increased light extraction efficiency can be manufactured.

BRIEF DESCRIPTION OF THE DRAWINGS

FIG. 1C is a flowchart of a manufacturing step for the semiconductor light emitting element according to Embodiment 1.

FIG. 3C is a flowchart showing the details of the second n-side nitride semiconductor layer provision step S2 according to Embodiment 3.

DETAILED DESCRIPTION

Figure 1A:
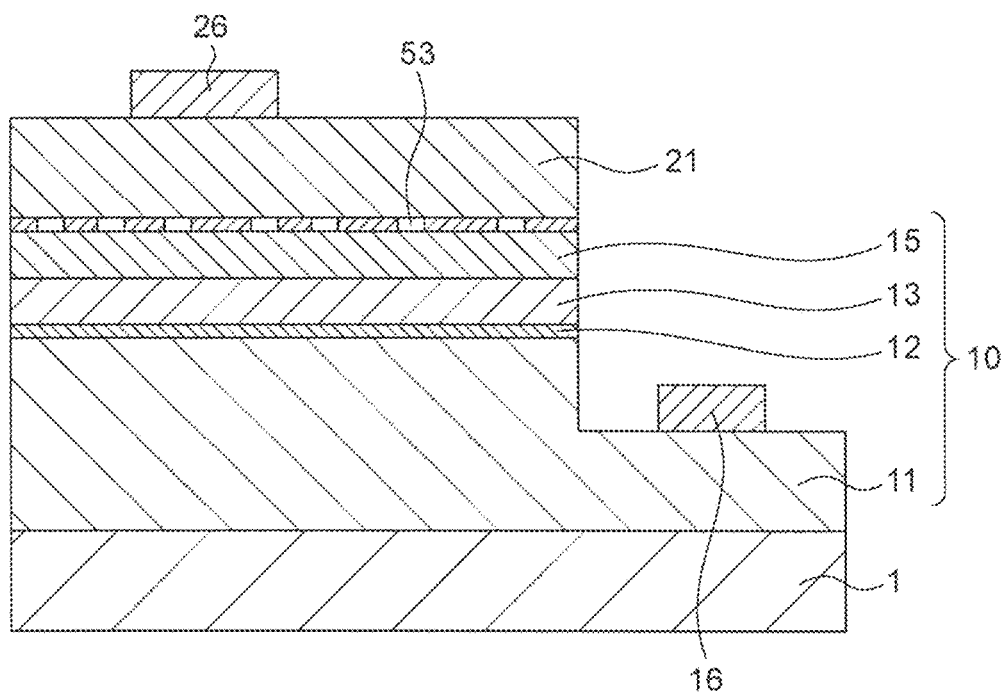
FIG. 1A is a cross-sectional view of a semiconductor light emitting element according to Embodiment 1.

Certain embodiments and examples of the present disclosure will be explained below with reference to the accompanying drawings. The semiconductor elements and the methods of manufacturing the semiconductor elements described below are presented for the purpose of giving shape to the technical ideas of the present disclosure, and are not intended to limit the present disclosure to those described below unless otherwise specifically noted.

In the drawings, the same reference numerals denote members having the same functions. To make the features easily understood, the descriptions of the features are distributed among the embodiments and examples, but the constituent elements described in different embodiments and examples can be replaced or combined in part. The explanation of common features already described in embodiments or examples appearing earlier might be omitted in the subsequent embodiments or examples where the explanation is focused only on the differences. Similar effects attributable to similar features, in particular, will not be mentioned each time an embodiment or example is discussed. The sizes of and positional relationships between the members shown in each drawing might be exaggerated for clarity of explanation.

A semiconductor light emitting element according to an embodiment of the present disclosure includes a first light emitting part, which at least includes a first n-side nitride semiconductor layer, a first active layer located on the first n-side nitride semiconductor layer, and a first p-side nitride semiconductor layer located on the first active layer, and a second n-side nitride semiconductor layer directly bonded to the first light emitting part. In a semiconductor light emitting element according to an embodiment, moreover, voids are created between the first bonding face of the first light emitting part 1 and the second bonding face of the second n-side nitride semiconductor layer that are directly bonded.

Because the light from the first light emitting part is scattered at the voids, the light extraction efficiency of the semiconductor light emitting element can be improved. Here, the voids are formed by, for example, the depressions and protrusions resulting from the surface roughness of the first bonding face and/or the depressions and protrusions resulting from the surface roughness of the second bonding face. In other words, in the semiconductor light emitting element according to an embodiment, there are first portions in which the first boding face is directly bonded to the second bonding face, and second portions in which the first bonding face faces the second bonding face via voids, at the bonded part between the first bonding face of the first light emitting part and the second bonding face of the second n-side nitride semiconductor layer. Direct bonding refers to having members come into direct contact with one another without using any resin or adhesive. In the case in which the first bonding face 51 is in direct contact with the second bonding face 52, for example, the direct connection of the atomic arrangements between the first bonding face 51 and the second bonding face 52 can be confirmed. The direct connection of the atomic arrangements can be confirmed by using, for example, a high-resolution transmission electron microscope. Direct bonding refers to a case in which layers are in direct contact and bonding with one another by, for example, surface activated bonding, atomic diffusion bonding, or the like. A nitride semiconductor in the present specification, refers to a binary to quaternary semiconductor comprising nitrogen (N) and at least one of boron (B), aluminum (Al), gallium (Ga), and indium (In).

In a semiconductor light emitting element according to an embodiment, moreover, the first bonding face of the first light emitting part that will be directly bonded to the second n-side nitride semiconductor layer may be located on the first n-side nitride semiconductor layer side or the first p-side nitride semiconductor side. For example, in the case of a semiconductor light emitting element in which a first n-side nitride semiconductor layer, a first active layer, and a first p-side nitride semiconductor layer are successively grown on a light transmissive substrate having light transmissivity, such as sapphire, directly bonding the second n-side nitride semiconductor layer on the first p-side nitride semiconductor layer side allows the light to be efficiently extracted. Also, directly bonding the second n-side nitride semiconductor layer on the first n-side nitride semiconductor layer side can increase light extraction efficiency.

A semiconductor light emitting element according to an embodiment as constructed above has, at the bonded part between the first bonding face of the first light emitting part and the second bonding face of the second n-side nitride semiconductor layer, first portions in which the first bonding face is directly bonded to the second bonding face, and second portions in which the first bonding face faces the second bonding face via voids. Thus, the light emitted by the first light emitting part can be efficiently scattered by the bonded part, and the light can be efficiently extracted from the emission face located opposite the bonded part.

Examples of more specific embodiments will be explained below with reference to the drawings.

Embodiment 1

Figure 1B:
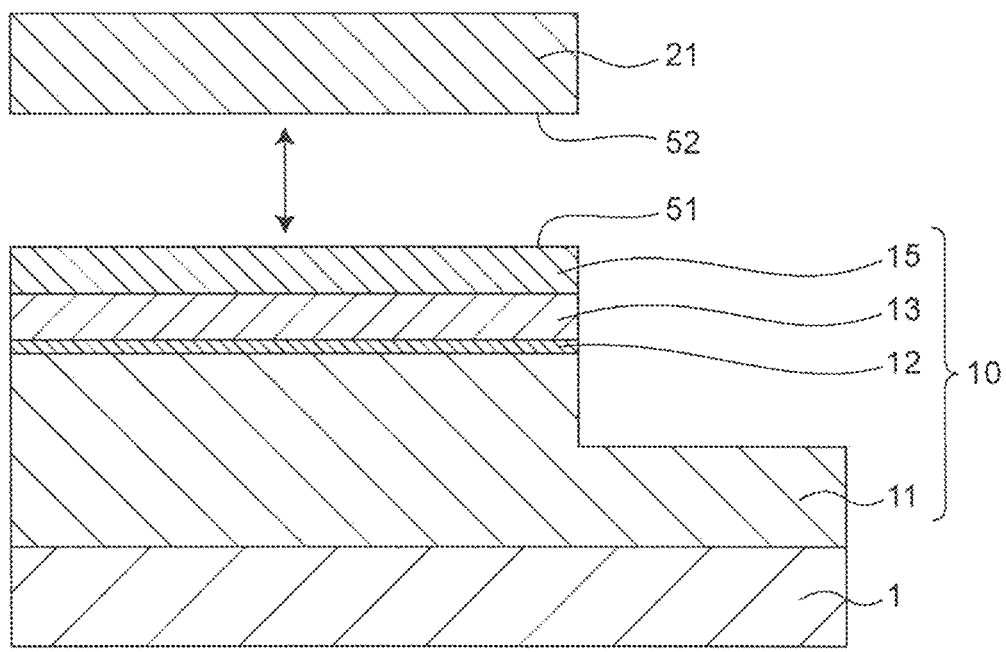
FIG. 1B is a cross-sectional view of the semiconductor light emitting element according to Embodiment 1 in which the directly bonded part is shown in a separated state.

FIG. 1A is a cross-sectional view of a semiconductor light emitting element according to Embodiment 1. FIG. 1B is a cross-sectional view showing the directly bonded part in a separated state in order to make the directly bonded part easily understood. As shown in FIG. 1A, the semiconductor light emitting element according to Embodiment 1 includes, for example, a substrate 1 having light transmissivity such as sapphire, a first light emitting part 10 disposed on the substrate 1, and a second n-side nitride semiconductor layer 21 directly bonded to the first light emitting part 10. In the semiconductor light emitting element according to Embodiment 1, in particular, the first light emitting part 10 includes a first n-side nitride semiconductor layer 11 disposed on the substrate 1, a first active layer 12 disposed on the first n-side nitride semiconductor layer 11, and a first p-side nitride semiconductor layer 13 disposed on the first active layer 12, as well as further including a bonding layer 15 disposed on the first p-side nitride semiconductor layer 13. In the semiconductor light emitting element according to Embodiment 1, moreover, the first bonding face 51 of the first light emitting part 10, i.e., the first bonding face 51 of the bonding layer 15, and the second bonding face 52 of the second n-side nitride semiconductor layer 21 are directly bonded. A bonding interface is formed between the bonding layer 15 and the second n-side nitride semiconductor layer 21. In Embodiment 1, the first bonding face 51 and the second bonding face 52 are directly bonded, for example, by surface activated bonding without interposing any adhesive.

Moreover, in the semiconductor light emitting element according to Embodiment 1, the bonding layer 15 is constructed with a nitride semiconductor containing an n-type impurity. As compared to directly bonding the first p-side nitride semiconductor layer 13 and the second n-side nitride semiconductor layer 21, directly bonding the bonding layer 15 and the second n-side nitride semiconductor layer 21 can readily spread an electric current to thereby increase the light emission efficiency of the semiconductor light emitting element.

The crystal planes of the first bonding face 51 and the second bonding face 52 to be directly bonded may be polar planes, semi-polar planes, or nonpolar planes. Preferably, polar planes can be used as the crystal planes of the first bonding face 51 and the second bonding face 52 to be directly bonded. For example, a polar plane is a c-plane. In this case, one of the first bonding face 51 and the second bonding face 52 is a −c-plane, and the other is a +c-plane. This can increase the output of the light emitting element. This can also increase the internal quantum efficiency. Because polar planes can be more easily provided than semi-polar planes or non-polar planes, they can be manufactured less expensively. In the present specification, a plane will be referred to as a +c-plane or −c-plane even if there is a deviation by about a growth substrate off-cut angle. The growth substrate off-cut angle is, for example, 0.5 degrees or less. For example, +c-plane is the Ga plane of GaN, and −c-plane is the N plane of GaN.

The semiconductor light emitting element according to Embodiment 1 as constructed above has at the bonded part between the first bonding face 51 of the first light emitting part 10, i.e., the first bonding face 51 of the bonding layer 15, and the second bonding face 52 of the second n-side nitride semiconductor layer 21, first portions in which the first bonding face 51 and the second bonding face 52 are directly bonded, and second portions in which the first bonding face 51 faces the second bonding face 52 via voids 53. This allows the light emitted by the first light emitting part 10 to be efficiently scattered at the bonded part to thereby efficiently extract the light.

It is believed that Rayleigh scattering occurs as the light emitted from the first light emitting part 10 goes through the voids, for example. By utilizing this, the light from the first light emitting part 10 can be efficiently extracted from the substrate 1 side.

It is preferable to allow the bonding layer 15 and the first p-side nitride semiconductor layer 13 to form a tunnel junction by increasing the n-type impurity concentration of the bonding layer 15 and/or the p-type impurity concentration of the first p-side nitride semiconductor layer 13. Allowing the bonding layer 15 and the first p-side nitride semiconductor layer 13 to form a tunnel junction can reduce the width of the depletion layer formed between the two, thereby allowing for effective current injection into the first active layer 12.

Each constituent element of the semiconductor element according to Embodiment 1 will be explained in detail below.

Substrate

The material for the substrate 1 is, for example, sapphire, Si, SiC, GaN or the like. A buffer layer may be disposed between the substrate 1 and the first n-side nitride semiconductor layer 11. The substrate 1 may be removed after growing semiconductor layers such as a first n-side nitride semiconductor 11.

First Light Emitting Part 10

In the first light emitting part 10, which includes a first n-side nitride semiconductor layer 11, a first active layer 12, and a first p-side nitride semiconductor layer 13, a plurality of semiconductor layers formed of nitride semiconductors are stacked. Nitride semiconductors can include all semiconductors obtained by varying the composition ratio x and y within their ranges in the chemical formula $In_xAl_yGa_{1-x-y}N$ ($0 \le x \le 1$, $0 \le y \le 1$, $x+y \le 1$). In the first light emitting part 10, the first n-side nitride semiconductor layer 11, the first active layer 12, and the first p-side nitride semiconductor layer 13 are stacked from the substrate 1 side in that order.

First n-Side Nitride Semiconductor Layer 11

The first n-side nitride semiconductor layer 11 has a nitride semiconductor layer containing an n-type impurity, such as silicon (Si), germanium (Ge), or the like. The first n-side nitride semiconductor layer 11 includes one or more n-type nitride semiconductor layers. The first n-side nitride semiconductor layer 11 may include an undoped semiconductor layer as a part. Here, an undoped semiconductor layer refers to a layer to which no n-type impurity and/or p-type impurity is intentionally added. The n-type impurity concentration or the p-type impurity concentration of an undoped semiconductor layer has a concentration below the detectable limit in a secondary ion mass spectroscopy (SIMS) analysis, for example. In the case in which an undoped semiconductor layer contains, for example, Si as an n-type impurity, the n-type impurity concentration is $1 \times 10^{16}/cm^{-3}$ or less, and Ge as an n-type impurity, the n-type impurity concentration is $1 \times 10^{17}/cm^{-3}$ or less. The first n-side nitride semiconductor layer 11, for example, includes an n-type GaN layer, and the thickness of the n-type GaN layer can be set to 5 μm to 15 μm. In the case in which the n-type GaN layer contains Si as an n-type impurity, the n-type impurity concentration of the n-type GaN layer can be set, for example, as $1 \times 10^{18}/cm^{-3}$ to $1 \times 10^{19}/cm^{-3}$.

First Active Layer 12

The first active layer 12 is disposed between the first n-side nitride semiconductor layer 11 and the first p-side nitride semiconductor layer 13. The first active layer 12 is a light emitting layer. The first active layer 12 is, for example, a nitride semiconductor layer emitting light having a peak emission wavelength in the 200 nm to 760 nm range. The first active layer 12 has, for example, a multiple quantum well structure that includes a plurality of well layers and a plurality of barrier layers. In the case in which the first active layer 12 is of a quantum well structure that emits light in the above wavelength range, the well layers are, for example, GaN, InGaN, or AlGaN, and the barrier layers are, for example, AlGaN or GaN. Between the first n-side nitride semiconductor layer 11 and the first active layer 12, a superlattice layer in which undoped GaN layers and undoped InGaN layers are alternately stacked may be formed.

First p-Side Nitride Semiconductor Layer 13

The first p-side nitride semiconductor layer 13 has, for example, a nitride semiconductor layer containing a p-type impurity such as magnesium (Mg) or the like. The first p-side nitride semiconductor layer 13 includes one or more p-type nitride semiconductor layers. In order to form a tunnel junction with the bonding layer 15 described later, at least the layer to be in contact with the bonding layer 15 is preferably a nitride semiconductor layer containing a p-type impurity. The nitride semiconductor configuring the p-type nitride semiconductor layer is, for example, a p-type GaN layer, and may contain In and/or Al. The thickness of the p-type GaN layer can be set as 0.04 μm to 0.2 μm. In the case in which the p-type GaN layer contains Mg as a p-type impurity, the p-type impurity concentration of the p-type GaN layer can be set, for example, as $1\times10^{19}/cm^{-3}$ to $3\times10^{20}/cm^{-3}$. The first p-side nitride semiconductor layer 13 may include an undoped semiconductor layer, for example.

Bonding Layer 15

The first light emitting part 10 further includes a bonding layer 15, and the upper face of the bonding layer 15 can serve as the first bonding face 51. The bonding layer 15 is a nitride semiconductor layer containing an n-type impurity, such as Si, Ge, or the like. The bonding layer 15 is formed to be in contact with the first p-side nitride semiconductor layer 13. The bonding layer 15 is, for example, an n-type GaN layer, and may contain In and/or Al. The n-type impurity concentration of the bonding layer 15 is higher than the n-type impurity concentration of the second n-side nitride semiconductor layer 21 described later. This can broadly diffuse an electric current in the in-plane direction, thereby spreading the electric current in the regions directly under the voids 53. This can also reduce the width of the depletion layer formed between the bonding layer 15 and the first p-side nitride semiconductor layer 13, thereby allowing for effective current injection into the first active layer 12. The n-type impurity concentration of the bonding layer 15 is, for example, in a range of $2\times10^{20}/cm^{-3}$ to $1\times10^{22}/cm^{-3}$, and setting the concentration to fall within such a range allows the bonding layer to form a tunnel junction with the first p-side nitride semiconductor layer 13 to thereby reduce the forward voltage, for example. The n-type impurity concentration of the bonding layer 15 is preferably in a range of $2\times10^{20}/cm^{-3}$ to $1\times10^{21}/cm^{-3}$, more preferably $2\times10^{20}/cm^{-3}$ to $5\times10^{20}/cm^{-3}$. This can reduce the crystallinity deterioration of the bonding layer 15 attributable to a high impurity concentration while allowing the bonding layer to form a tunnel junction with the first p-side nitride semiconductor layer 13, thereby reducing the degradation of the characteristics of the semiconductor light emitting element. The n-type impurity concentration of the bonding layer 15 may be uniform across the thickness of the bonding layer 15, or varied gradually. The thickness of the bonding layer 15 is, for example, in a range of 10 nm to 200 nm, preferably 10 nm to 100 nm, more preferably 20 nm to 50 nm, even more preferably 30 nm to 45 nm. This can reduce the width of the depletion layer, thereby reducing the forward voltage while increasing the output. The thickness of the bonding layer 15 can be analyzed in detail by using a STEM (scanning transmission electron microscope) in combination with an EDS (energy dispersive X-ray spectroscopy) analysis.

Second n-Side Nitride Semiconductor Layer

The second n-side nitride semiconductor layer 21 includes a nitride semiconductor layer containing an n-type impurity, such as silicon (Si), germanium (Ge), or the like. The second n-side nitride semiconductor layer 21 includes one or more n-type nitride semiconductor layers. The second n-side nitride semiconductor layer 21 may include an undoped semiconductor layer as a part. The n-type impurity concentration (the third concentration) of the second n-side nitride semiconductor layer 21 is lower than the n-type impurity concentration of the bonding layer 15. The second n-side nitride semiconductor layer 21 includes, for example, an n-type GaN layer, and the thickness of the n-type GaN layer can be set as 0.1 μm to 15 μm. The thickness of the n-type GaN layer can preferably be set in a range of 0.1 μm to 5 μm, more preferably 0.1 μm to 3 μm, particularly preferably 0.1 μm to 1 μm. This can reduce the absorption of light in the second n-side nitride semiconductor layer 21. In the case in which the n-type GaN layer contains Si as an n-type impurity, the n-type impurity concentration of the n-type GaN layer can be set, for example, in a range of $1\times10^{18}/cm^{-3}$ to $1\times10^{19}/cm^{-3}$.

A method of manufacturing a semiconductor element according to an embodiment will be explained below. A semiconductor light emitting element is manufactured by, for example, MOCVD (metalorganic chemical vapor deposition) in a pressure and temperature adjustable chamber. Each nitride semiconductor layer can be formed by introducing into the chamber a carrier gas and a source gas. For the carrier gas, a hydrogen ($H_2$) gas or a nitrogen ($N_2$) gas can be used. For the N source gas, an ammonia ($NH_3$) gas can be used. For the Ga source gas, a trimethyl gallium (TMG) gas, or a triethyl gallium (TEG) gas can be used. For the In source gas, a trimethyl indium (TMI) gas can be used. For the Al source gas, a trimethyl aluminum (TMA) gas can be used. For the Si source gas, a monosilane ($SiH_4$) gas can be used. For the Mg source gas, a bis(cyclopentadienyl) magnesium ($Cp_2Mg$) gas can be used.

A method of manufacturing a semiconductor element according to an embodiment includes: providing a first light emitting part that includes a first active layer; providing a first semiconductor layer; forming a first bonding face that extends in a first crystal plane by subjecting a first principal face of the first light emitting part to one of the two, an acidic or alkaline solution treatment or polishing; forming a second bonding face that extends in a second crystal plane having a plane orientation different from that of the first crystal plane by subjecting a second principal face of the first semiconductor layer to the other of the two, an acidic or alkaline solution treatment or polishing; and directly bonding the first bonding face and the second bonding face.

The first light emitting part provision step is, for example, a step of providing a first light emitting part that includes a first n-side nitride semiconductor layer, a first active layer disposed on the first n-side nitride semiconductor layer, and a first p-side nitride semiconductor layer disposed on the first active layer. The first semiconductor layer provision step is, for example, a step of providing a second n-side nitride semiconductor layer.

Figure 1D:
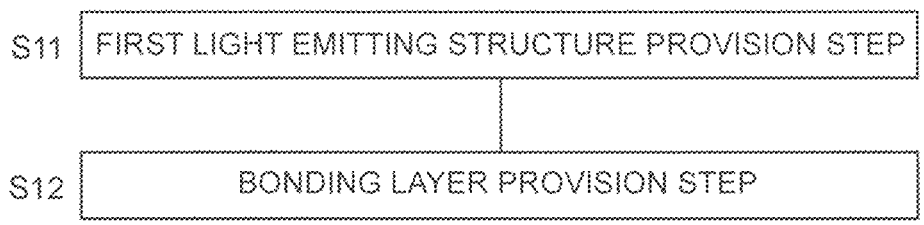
FIG. 1D is a flowchart showing the details of a first light emitting part provision step S1.

A method of manufacturing a semiconductor element according to an embodiment, as shown in FIG. 1C, includes a first light emitting part provision step S1, a second n-side nitride semiconductor layer provision step S2, a first bonding face forming step S3, a second bonding face forming step S4, and a direct bonding step S5. Here, a method of manufacturing a semiconductor element according to Embodiment 1, which includes a bonding layer 15, the first light emitting part provision step S1, as shown in FIG. 1D, includes a first light emitting structure provision step S11 and a bonding layer provision step S12.

Each step in the method of manufacturing a semiconductor element according to Embodiment 1 will be explained in detail below.

First Light Emitting Part Provision Step S1

In the first light emitting part provision step S1, a first light emitting part 10, which includes a first n-side nitride semiconductor layer 11, a first active layer 12 disposed on the first n-side nitride semiconductor layer 11, and a first p-side nitride semiconductor layer 13 disposed on the first active layer 12, is provided. In the manufacturing method of Embodiment 1, in the first light emitting structure provision step S11, a first light emitting structure is provided by growing on a substrate 1 formed of sapphire, for example, a first n-side nitride semiconductor layer 11, a first active layer 12, and a first p-side nitride semiconductor layer 13. The first light emitting structure can be formed by MOCVD, for example. Then in the bonding layer provision step S12, a bonding layer 15 is provided by growing on the first light emitting structure a nitride semiconductor layer containing an n-type impurity. The bonding layer 15 may be formed by the MOCVD mentioned above, or another method. For example, it can be formed by a physical vapor deposition (PVD). For PVD, for example, sputtering or molecular beam epitaxy (MBE) can be utilized. MBE is preferably used in forming the bonding layer 15. This can grow a high crystallinity bonding layer 15, thereby reducing the voltage increase caused by the bonding layer 15. In the manner described above, a first light emitting part 10 that includes a first light emitting structure and a bonding layer 15 is provided.

In the first light emitting part provision step S1, the layers are preferably grown such that the surface that will be the bonding face of the bonding layer 15 (the first principal face of the first light emitting part 10) becomes a specific crystal plane (hereinafter referred to as the first crystal plane). For example, when a first n-side nitride semiconductor layer 11, a first active layer 12, and a first p-side nitride semiconductor layer 13 are grown on the c-plane of a sapphire substrate 1, the first crystal plane, which is the bonding face of the bonding layer 15, will be a +c-plane. Here, the +c-plane is the terminal plane of a group III element. A −c-plane is an N-plane.

Second n-Side Nitride Semiconductor Layer Provision Step S2

Figure 1E:
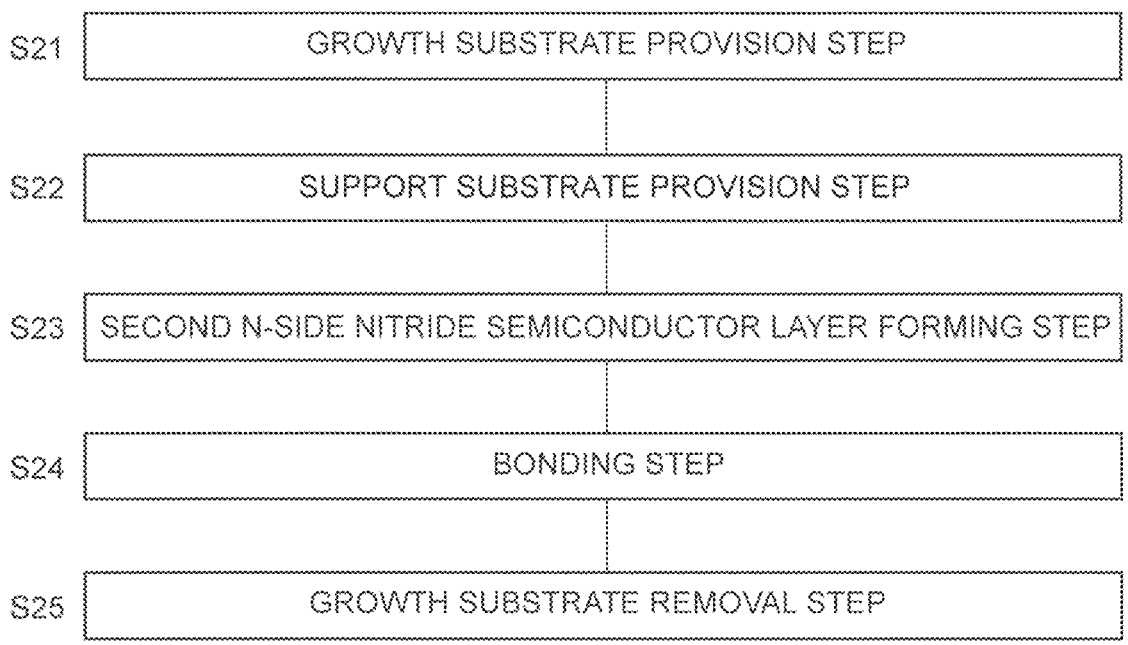
FIG. 1E is a flowchart showing the details of a second n-side nitride semiconductor layer provision step S2.
Figure 1F:
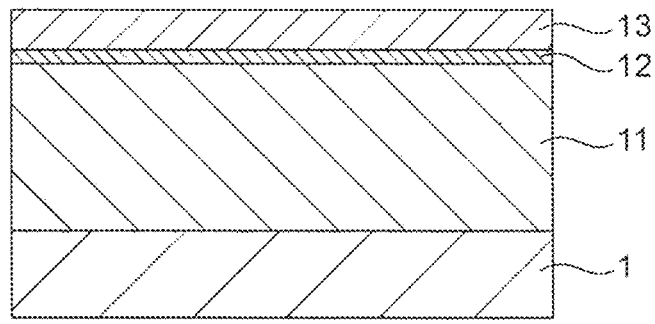
FIG. 1F is a schematic cross-sectional view showing a step in the first light emitting part provision step S1.
Figure 1G:
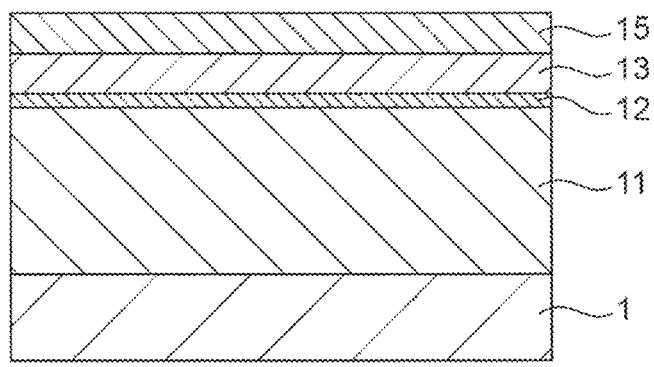
FIG. 1G is a schematic cross-sectional view showing another step in the first light emitting part provision step S1.

In the second n-side nitride semiconductor layer provision step S2, a second n-side nitride semiconductor layer 21 is provided. The second n-side nitride semiconductor layer provision step S2, as shown in FIG. 1E, can include a growth substrate provision step S21, a support substrate provision step S22, a second n-side nitride semiconductor layer forming step S23, a bonding step S24, and a growth substrate removal step S25.

Figure 1H:
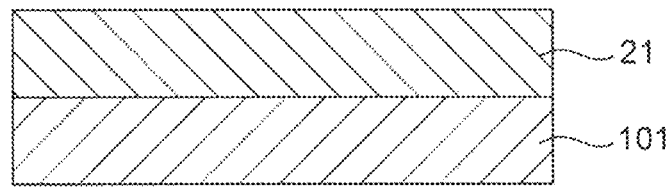
FIG. 1H is a schematic cross-sectional view showing a step in the second n-side nitride semiconductor layer provision step S2.

In the growth substrate provision step S21, for example, a growth substrate formed of sapphire is provided. Then in the support substrate provision step S22, for example, a support substrate 105 formed of sapphire is provided. Then in the second n-side nitride semiconductor layer forming step S23, a second n-side nitride semiconductor layer 21 formed of a nitride semiconductor containing an n-type impurity is grown on the growth substrate 101 by MOCVD (FIG. 1H).

Figure 1I:
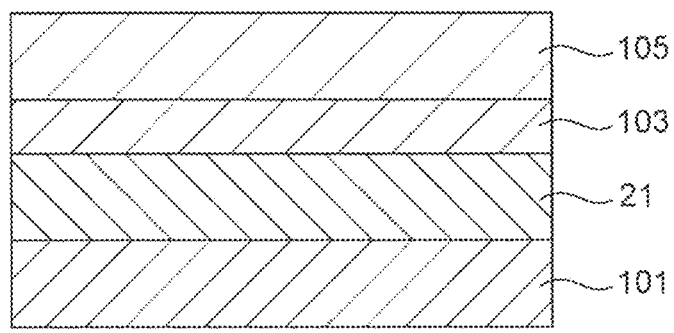
FIG. 1I is a schematic cross-sectional view showing another step in the second n-side nitride semiconductor layer provision step S2.
Figure 1J:
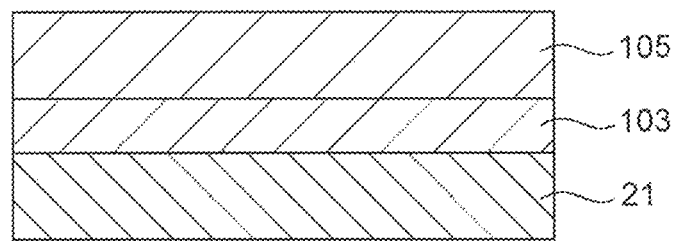
FIG. 1J is a schematic cross-sectional view showing another step in the second n-side nitride semiconductor layer provision step S2.

Then in the bonding step S24, a resin layer 103 and a support substrate 105 are disposed on the second n-side nitride semiconductor layer 21 in that order (FIG. 1I). Then in the growth substrate removal step S25, the growth substrate 101 is removed from the second n-side nitride semiconductor layer 21 (FIG. 1J). The surface of the second n-side nitride semiconductor layer 21, which is the bonding face (hereinafter, also referred to as the second principal face), is preferably a crystal plane (the second crystal plane) having a plane orientation different from that of the first crystal plane. The second crystal plane having a plane orientation different from that of the first plane makes it easier to create an arithmetic mean roughness difference between the bonding faces in the first bonding face forming step and the second bonding face forming step described later, thereby facilitating the formation of voids 53. For example, in the case of growing a second n-side nitride semiconductor layer 21 on the c-plane of the growth substrate 101 formed of sapphire, the second crystal plane obtained after removing the growth substrate will be a −c-plane that has a plane orientation different from the first crystal plane that is a +c-plane.

First Bonding Face Forming Step S3

In the first bonding face forming step S3, the first principal face of the first light emitting part 10 is treated by using an acidic or alkaline solution to clean the first principal surface. This can remove any oxide film or unnecessary bond that can impede direct bonding. An unnecessary bond that impedes direct bonding refers to bond not forming a nitride, for example, a bond between a Ga atom and a Ga atom. A conceivable cause of such an unnecessary bond to occur to impede direct bonding, for example, is the temperature decline below the nitride forming condition when the temperature is reduced subsequent to forming a bonding layer. Treating the surface with an acidic or alkaline solution can form a first bonding face 51 that extends in the first crystal plane. The first bonding face 51 that extends in the first crystal plane can be formed by, for example, putting the first principal face of the first light emitting part 10 in an acidic or alkaline solution. In the first bonding face forming step S3, nanometer-order depressions and protrusions can be created on the first bonding face 51 by treating it with an acidic or alkaline solution. The nanometer-order depressions and protrusions here refer to depressions and protrusions formed on a flattened surface having an arithmetic mean roughness of 3 nm or less, for example. The nanometer-order depressions and protrusions are preferably depressions and protrusions formed on a flattened surface having an arithmetic mean roughness of 1 nm or less, more preferably depressions and protrusions formed on a flattened surface having an arithmetic mean roughness of 0.5 nm or less. This can directly bond the first light emitting part 10 and the second n-side nitride semiconductor layer. For the acidic or alkaline solution, in the case of an acidic solution, $H_2SO_4$ (sulfuric acid), HF (hydrofluoric acid), or HCl (hydrochloric acid), for example, can be used. For the acidic or alkaline solution, in the case of an alkaline solution, TMAH (tetramethyl ammonium hydroxide) or KOH (potassium hydroxide), for example, can be used. For the acidic or alkaline solution, TMAH is preferably used. This can remove the organic substances, oxide film, residual metals, or the like formed on the first principal face. As for the acidic or alkaline solution treatment conditions, in the case of TMAH, for example, the treatment temperature is 30° C. to 90° C., preferably 50° C. to 85° C. In the case of TMAH, the treatment time is, for example, 1 to 30 minutes. For example, the putting-in treatment can be performed at 70° C. for 20 minutes. In the case in which the first crystal plane is a +c-plane, it is preferable not to subject the first principal face to the chemical mechanical polishing (CMP) described later. In the case in which the first crystal plane is a +c-plane, treating the first principal face with an acidic or alkaline solution can form a first bonding face having a lower arithmetic mean roughness than that resulting from subjecting the first principal face to CMP.

Second Bonding Face Forming Step S4

In the second bonding face forming step S4, the second principal face of the second n-side nitride semiconductor layer 21 is subjected to CMP or the like, for example, to remove the oxide film or the like formed on the surface as well as flattening the surface. This forms the second bonding face 52 that extends in the second crystal plane having a plane orientation different from that of the first crystal plane. In the second bonding face forming step S4, performing CMP can form a flattened second bonding face 52 having smaller depressions and protrusions than those of the first bonding face 51. The arithmetic mean roughness of the second bonding face 52 is 1 nm or less, preferably 0.5 nm or less, more preferably 0.2 nm or less. Here, CMP is performed by using a pad while dripping a slurry made by mixing silica particles in an alkaline solution such as KOH, for example. In the second bonding face forming step S4, mechanical polishing may be performed before performing CMP on the second principal face.

Direct Bonding Step S5

Figure 1K:
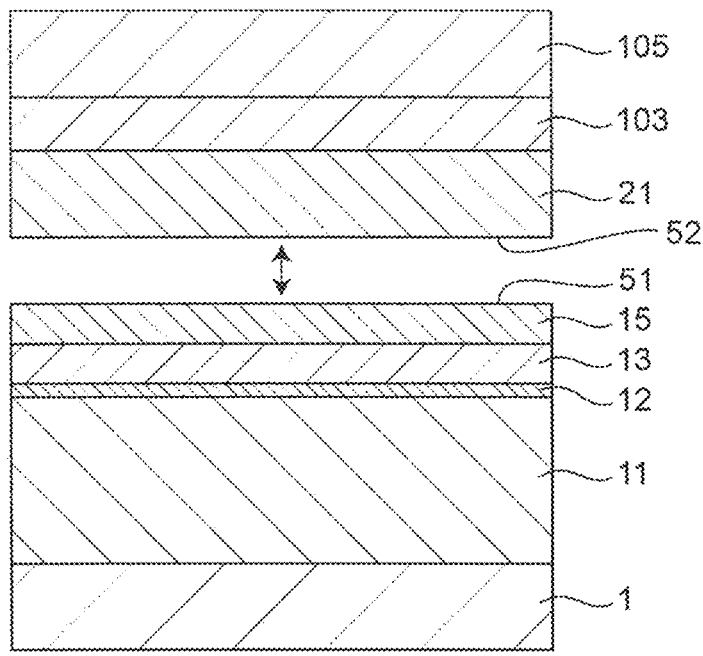
FIG. 1K is a schematic cross-sectional view showing a step in the direct bonding step S5.
Figure 1L:
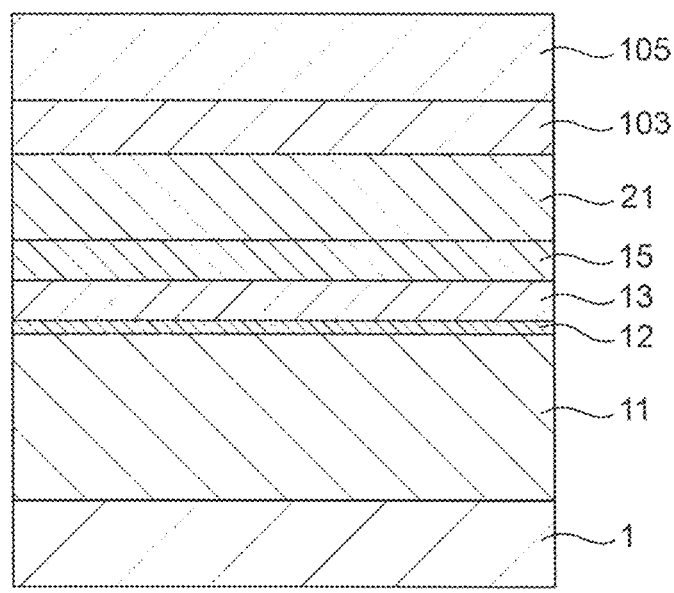
FIG. 1L is a schematic cross-sectional view showing another step in the direct bonding step S5.

In the direct bonding step S5, the first bonding face 51 that extends in a first crystal plane and the second bonding face 52 that extends in a second crystal plane having a plane orientation different from that of the first bonding face are directly bonded (FIG. 1K and FIG. 1L).

The direct bonding of the first bonding face 51 and the second bonding face 52 is accomplished by surface activated bonding, for example. Surface activated bonding is a method generally performed after flattening and cleaning both bonding surfaces. The cleaning step is performed, for example, by irradiating each bonding face with ion beams in a vacuum chamber. In Embodiment 1, the first bonding face 51 obtained by treating with an acidic or alkaline solution has nanometer-order depressions and protrusions. On the other hand, the second bonding face 52 is flattened by CMP so as to have smaller depressions and protrusions than those of the first bonding face 51. These first bonding face 51 and the second bonding face 52 are directly bonded. The bonding interface is formed between the bonding layer 15 and the second n-side nitride semiconductor layer 21. Directly bonding the first bonding face 51 and the second bonding face 52 in this manner can form, in the bonded part, the first portions in which the first bonding face 51 is directly bonded to the second bonding face 52, and the second portions in which the first bonding face 51 faces the second bonding face 52 via voids 53. In other words, the first portions in which the first bonding face 51 is directly in contact with the second bonding face 52 without interposing any adhesive and the second portions in which the first bonding face 51 faces the second bonding face 52 via voids 53 are formed at the bonded part between the first bonding face 51 and second bonding face 52. In the case in which the first bonding face 51 is in direct contact with the second bonding face 52, for example, a direct connection of the atomic arrangements between the first bonding face 51 and the second bonding face 52 can be confirmed. The direct connection between the atomic arrangements can be confirmed by using a high-resolution electron microscope. The bonding interface that includes voids and is located between the first light emitting part 10 and the second n-side nitride semiconductor layer 21 can include crystalline regions. This can reduce the absorption of light by the bonding interface. The crystalline regions may be single crystal regions. The maximum length of a nanometer-order void 53 is, for example, 50 nm or less, preferably 30 nm or less, more preferably 20 nm or less, even more preferably 10 nm or less. This can make the voids 53 sufficiently smaller than the wavelength of the light from the first light emitting part 10, thereby allowing the voids to efficiently scatter the light from the first light emitting part 10. The maximum length of a void 53 can be estimated by the method described below. By observing a TEM image of a cross section of a semiconductor light emitting element, the long diameter of each void observed between the first bonding face 51 and the second bonding face 52 in about the 660 μm range region along the bonding interface is measured. The largest one among them can be used as the estimated maximum length of voids 53. Voids 53 having targeted sizes can be formed, for example, by adjusting the type of the acidic or alkaline solution and the treatment conditions in the first bonding face forming step S3 and the bonding conditions in the direct bonding step S5. The bonding conditions here include, in surface activated bonding, ion beam irradiation time, bonding pressure, temperature during the application of pressure, duration of the pressurized state, and the like. The pressure applied during surface activated bonding, for example, is 10 MPa to 200 MPa, preferably 50 MPa to 150 MPa. The temperature range during the application of pressure is, for example, 0° C. to 70° C., preferably 0° C. to 50° C., more preferably 0° C. to 30° C. In this manner, the first light emitting 10 and the second n-side nitride semiconductor layer 21 can be firmly bonded.

When bonding in the direct bonding step, the crystal axial direction in the first crystal plane may be, but does not have to be, aligned with the crystal axial direction in the second crystal plane. Assuming that the first crystal plane is a +c-plane and the second crystal plane is a −c-plane, for example, these two crystal planes may be bonded by shifting the in-plane a-axis direction of the first crystal plane (+c-plane) from the in-plane a-axis direction of the second crystal plane (−c-plane). This eliminates the necessity of aligning the crystal orientations of the bonding faces in the direct bonding step, thereby simplifying the manufacturing step. According to the manufacturing method of Embodiment 1, even if the crystal axial direction in the first crystal plane is not aligned with the crystal axial direction in the second crystal plane during direct bonding, the crystal planes (the first crystal plane and the second crystal plane) can be bonded with one another. It is usually considered difficult to bond the surfaces if the crystal axes are misaligned, which can apply stress and/or strain to the bonding faces. However, in the direct bonding step according to Embodiment 1, the first light emitting part and the second n-side nitride semiconductor layer can be firmly bonded. The misalignment of the crystal axes can be confirmed by observing the rotational symmetry of an asymmetric surface by performing XRD φ rotation scanning. The misalignment of the crystal axes between the first crystal plane and the second crystal plane can be observed repeatedly in accordance with the rotational symmetry. The asymmetric surface, for example, is the (102) plane of gallium nitride.

The first bonding face 51 and the second bonding face 52 are preferably annealed after directly bonding the two. This can reduce the electrical resistance of the semiconductor light emitting element. This is believed to be because annealing can enhance the adhesion while maintaining the crystallinity in the vicinity of the bonding interface. Annealing is performed, for example, without applying any pressure. The temperature in the chamber during the heat treatment is, for example, within the 300° C. to 700° C. range, preferably the 350° C. to 600° C. range, more preferably the 350° C. to 450° C.

The annealing temperature is suitably set within the ranges described above according to the nitride semiconductor materials used for the bonding layer 15 and the second n-side nitride semiconductor layer 21. For example, in the case of forming both the bonding layer 15 and the second n-side nitride semiconductor layer 21 with GaN, it is believed that annealing at a temperature within the above ranges can improve the adhesion between the bonding layer 15 and the second n-side nitride semiconductor layer 21 while maintaining the crystallinity.

Furthermore, the annealing step can simultaneously heat the resin layer 103 and the support substrate 105 disposed on the second n-side nitride semiconductor layer 21. In other words, the annealing step can remove the support substrate 105 by melting or burning off the resin layer 103. Accordingly, the second n-side nitride semiconductor layer 21 is less likely to be separated from the first light emitting part 10 when removing the support substrate 105 from the resin layer 103. After removing the resin layer and the support substrate, the surface of the second n-side nitride semiconductor layer 21 is cleaned, and an electrode 26 can be formed on the cleaned surface.

The manufacturing method according to Embodiment 1 described above forms a first bonding face 51 that extends in a first crystal plane by treating the first principal face of the first light emitting part 10 with an acidic or alkaline solution in the first bonding face forming step S3, forms a second bonding face 52 that extends in a second crystal plane having a plane orientation different from that of the first crystal plane by polishing the second principal face of the second n-side nitride semiconductor layer 21 in the second bonding face forming step S4, and then directly bonds the first bonding face 51 and the second bonding face 52 in the direct bonding step S5.

This allows the crystal planes (the first crystal plane and the second crystal plane) to come into contact with one another to achieve good bonding at the bonded part, as well as forming nanometer-order voids 53 between the first crystal plane and the second crystal plane.

Here, the maximum length of a void 53 is 50 nm or less, preferably 30 nm or less, more preferably 20 nm or less, even more preferably 10 nm or less.

Accordingly, a semiconductor light emitting element produced by the manufacturing method of Embodiment 1 provided with nanometer-order voids 53 between the first crystal plane and the second crystal plane can scatter the light from the first light emitting part 10 and allows for efficient extraction of light from the semiconductor light emitting element.

In the case of a semiconductor light emitting element according to Embodiment 1, the form in which a bonding layer 15 was provided on the first p-side nitride semiconductor layer 13 was described. However, the second n-side nitride semiconductor layer 21 can include a bonding layer 15, and the lower face of the bonding layer 15 can be used as the second bonding face. In other words, the first bonding face 51 formed in the upper face of the first p-side nitride semiconductor layer 13 and the second bonding face 52 formed in the lower face of the bonding layer 15 included in the second n-side nitride semiconductor layer 21 can be directly bonded. The bonding interface is formed between the first p-side nitride semiconductor layer 13 and the bonding layer 15. Similar to Embodiment 1, the directly bonded part includes first portions in which the first bonding face 51 is directly bonded to the second bonding face 52, and second portions in which the first bonding face 51 faces the second bonding face 52 via voids 53. The light emitted by the first light emitting part 10 can be scattered by the bonded part to thereby increase the light extraction efficiency. Moreover, the bonding layer containing an n-type impurity included in the semiconductor light emitting element can spread the electric current to further improve the light extraction efficiency of the semiconductor light emitting element.

In the Embodiment 1 explained thus far, a region in the vicinity of the bonding interface that includes voids 53 can be a crystallinity disrupted region as compared to a region sufficiently distant from the bonding interface formed by direct bonding. A region sufficiently distant from the bonding interface is a region in which a periodic atomic arrangement can be clearly observed in a TEM analysis, for example. A periodic atomic arrangement can be found in a region at least 5 nm away from the bonding interface. A periodic atomic arrangement can also be found in a region at least 20 nm away from the bonding interface. For example, as compared to an internal portion of the bonding layer 15 or an internal portion of the second n-side nitride semiconductor layer 21 that is sufficiently distant from the bonding interface, a region that includes the bonding interface can become a disrupted region. FIG. 1A illustrates with emphasis the state in which the crystallinity disrupted region is formed at the bonding interface that includes voids formed after direct bonding, as confirmed by Example 2 below, for example. However, such a crystallinity disrupted region does not have to be formed at the bonding interface. In the other embodiments described below, the crystallinity disrupted regions similar to that in FIG. 1A will be illustrated.

Embodiment 2

Figure 2A:
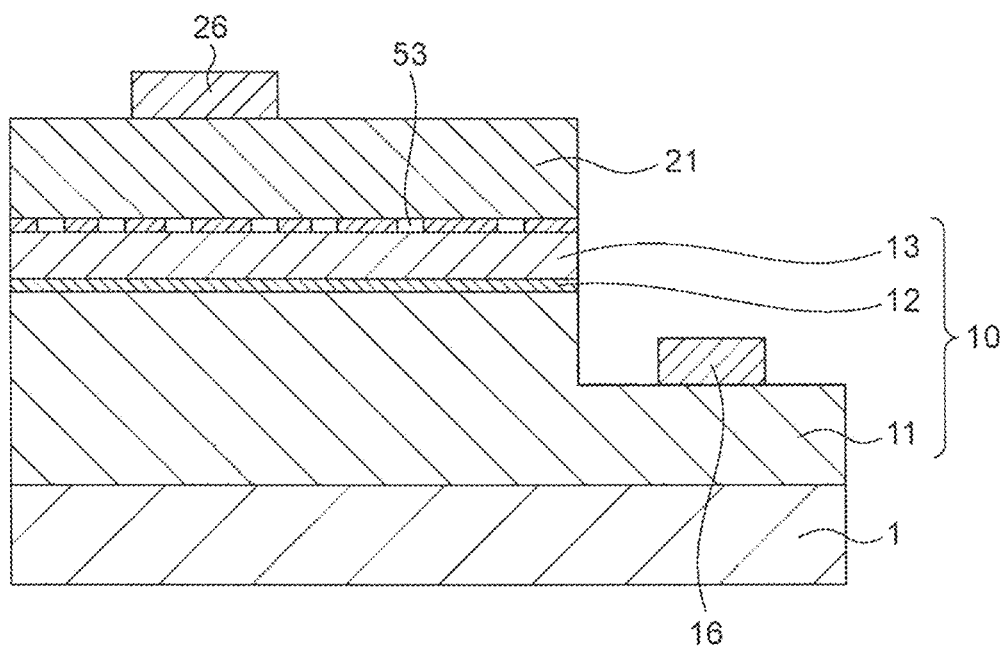
FIG. 2A is a cross-sectional view of a semiconductor light emitting element according to Embodiment 2.
Figure 2B:
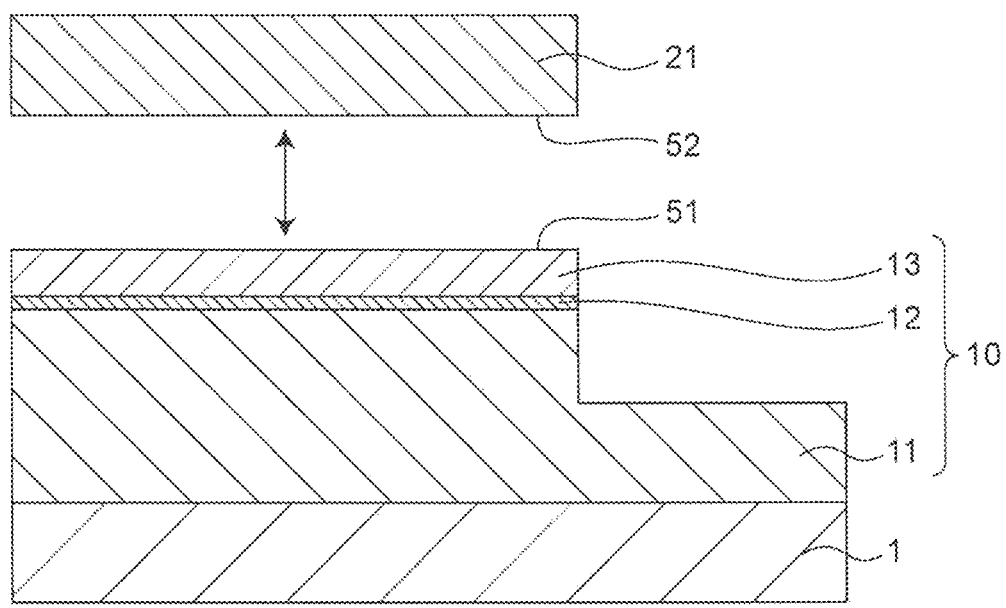
FIG. 2B is a cross-sectional view of the semiconductor light emitting element according to Embodiment 2 in which the directly bonded part is shown in a separated state.

FIG. 2A is a cross-sectional view of a semiconductor light emitting element according to Embodiment 2. FIG. 2B is a cross-sectional view in which the directly bonded part is shown in a separated state in order to make the directly bonded part easily understood. As shown in FIG. 2A, the semiconductor light emitting element according to Embodiment 2 is constructed in a similar manner to the semiconductor light emitting element according to Embodiment 1 except that the semiconductor light emitting element of Embodiment 2 does not include a bonding layer 15.

Specifically, as shown in FIG. 2A, the semiconductor light emitting element of Embodiment 2 includes, for example, a substrate 1 having light transmissivity such as sapphire, a first light emitting part 10 that includes a first n-side nitride semiconductor layer 11 disposed on the substrate 1, a first active layer 12, and a first p-side nitride semiconductor layer 13, and a second n-side nitride semiconductor layer 21 directly bonded to the first light emitting part 10. In the semiconductor light emitting element of Embodiment 2, the first light emitting part 10 includes a first n-side nitride semiconductor layer 11 disposed on the substrate 1, a first active layer 12 disposed on the first n-side nitride semiconductor layer 11, and a first p-side nitride semiconductor layer 13 disposed on the first active layer 12, in which the upper face of the first p-side nitride semiconductor layer 13 is the first bonding face 51, and the first bonding face 51 is directly bonded to the second bonding face 52 of the second n-type nitride semiconductor layer 21. The bonding interface is formed between the first p-side nitride semiconductor layer 13 and the second n-side nitride semiconductor layer 21.

In the manufacturing method of Embodiment 2, a first bonding face 51 that extends in a first crystal plane can be formed by treating the surface of the first p-side nitride semiconductor layer 13 with an acidic or alkaline solution. A second bonding face 52 can be formed in a similar manner as Embodiment 1.

The semiconductor light emitting element of Embodiment 2 as constructed above has, similar to Embodiment 1, at the bonded part between the first bonding face 51 of the first light emitting part 10, i.e., the first bonding face 51 of the first p-side nitride semiconductor layer 13, and the second bonding face 52 of the second n-side nitride semiconductor layer 21, first portions in which the first bonding face 51 is directly bonded to the second bonding face 52, and second portions in which the first bonding face 51 faces the second bonding face 52 via voids 53. In this manner, similar to the semiconductor light emitting element of Embodiment 1, the light from the first light emitting part 10 can be scattered by the bonded part to be efficiently extracted.

Embodiment 3

Figure 3A:
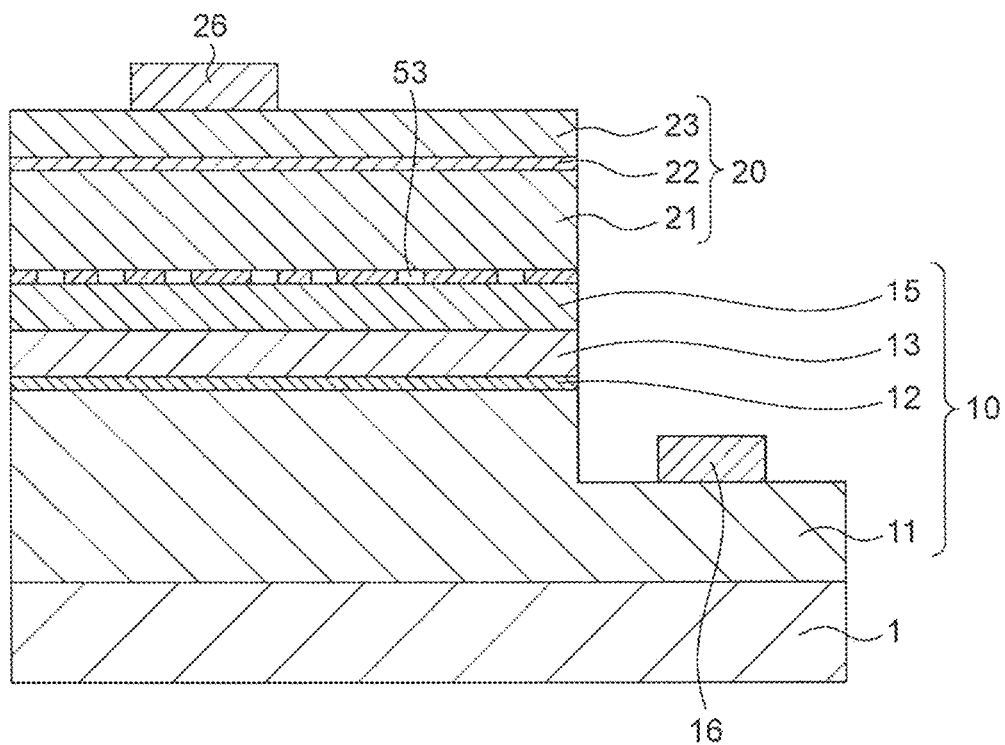
FIG. 3A is a cross-sectional view of a semiconductor light emitting element according to Embodiment 3.
Figure 3B:
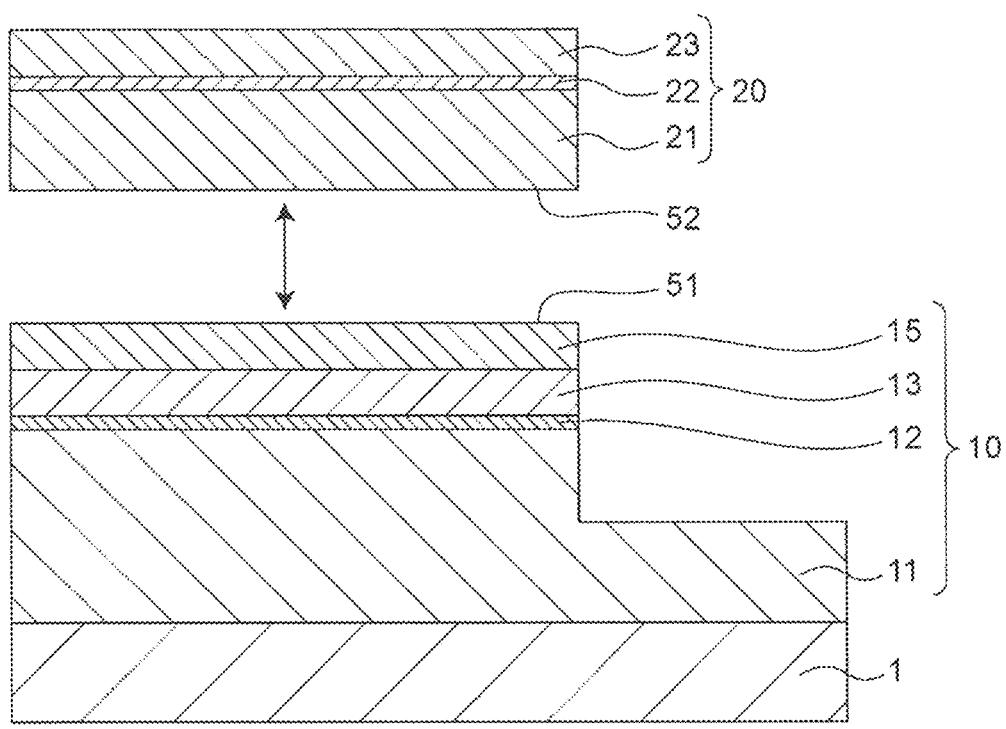
FIG. 3B is a cross-sectional view of the semiconductor light emitting element according to Embodiment 3 in which the directly bonded part is shown in a separated state.

FIG. 3A is a cross-sectional view of a semiconductor light emitting element according to Embodiment 3. FIG. 3B is a cross-sectional view in which the directly bonded part is shown in a separated state in order to make the directly bonded part easily understood. As shown in FIG. 3A, the semiconductor light emitting element according to Embodiment 3 includes, for example, a substrate 1 having light transmissivity such as sapphire, a first light emitting part 10 disposed on the substrate 1, and a second light emitting part 20 that includes a second n-side nitride semiconductor layer 21 directly bonded to the first light emitting part 10. The semiconductor light emitting element of Embodiment 3 is constructed in a similar manner to the semiconductor light emitting element of Embodiment 1 except that the semiconductor light emitting element of Embodiment 3 includes the second light emitting part 20. In other words, in the semiconductor light emitting element of Embodiment 3, the first light emitting part 10 includes a bonding layer 15 disposed on the first p-side nitride semiconductor layer 13, and the first bonding face 51 of the bonding layer 15 is directly bonded to the second bonding face 52 of the second n-side nitride semiconductor layer 21. The bonding interface is formed between the bonding layer 15 and the second n-side nitride semiconductor layer 21. In the semiconductor light emitting element of Embodiment 3, similar to the semiconductor light emitting element of Embodiment 1, the bonding layer 15 is composed of a nitride semiconductor containing an n-type impurity.

In the semiconductor light emitting element of Embodiment 3, the second light emitting part 20 includes a second n-side nitride semiconductor layer 21, a second active layer 22 disposed on the second n-side nitride semiconductor layer 21, and a second p-side nitride semiconductor layer 23 disposed on the second active layer 22. The second p-side nitride semiconductor layer 23 is disposed on the opposite side of the second bonding face 52 of the second n-side nitride semiconductor layer 21.

Here, the peak wavelength of the light emitted by the first light emitting part 10 and the peak wavelength of the light emitted by the second light emitting part 20 may be different or the same, but are preferably different. Because the degree of light scattering through the voids can be varied per wavelength, the light emitted by the semiconductor light emitting element that includes a first light emitting part 10 and a second light emitting part 20 can be efficiently extracted in one of two directions, the substrate 1 side and the second light emitting part 20 side. In the case of flip-chip mounting the semiconductor light emitting element, for example, the peak wavelength of the light emitted by the first light emitting part 10 is preferably shorter than the peak wavelength of the light emitted by the second light emitting part 20. This is because Rayleigh scattering is expected to occur when the light goes through the voids 53. The shorter the wavelength of light, the easier the Rayleigh scattering occurs, and the longer the wavelength of light, the harder the Rayleigh scattering occurs. Accordingly, providing the first light emitting part 10 having shorter wavelength of light than the wavelength of light of the second light emitting part 20 allows the light from the first light emitting part 10 to be more readily scattered through the voids 53 while reducing the scattering of the light from the second light emitting part 20 through the voids 53. This allows for the efficient extraction of the light from both the first light emitting part 10 and the second light emitting part 20. The semiconductor light emitting element can be made such that the light emitting part emits light having shorter wavelength as one is positioned closer to the light extraction face. The semiconductor light emitting element can emit, for example, blue light and green light, blue light and red light, or green light and red light. In the case of mounting the semiconductor light emitting element face up, it is believed that providing the second light emitting part 20 emitting the light of wavelength shorter than the peak wavelength of the light from the first light emitting part 10 can similarly efficiently extract light from the first light emitting part and the second light emitting part.

The semiconductor light emitting element of Embodiment 3 as constructed above has, at the bonded part between the first bonding face 51 of the bonding layer 15 and the second bonding face 52 of the second n-side nitride semiconductor layer 21, first portions in which the first bonding face 51 is directly bonded to the second bonding face 52, and second portions in which the first bonding face 51 faces the second bonding face 52 via voids 53. This allows the bonded part to scatter the light emitted by the first light emitting part or the second light emitting part, thereby efficiently extracting the light from the semiconductor light emitting element.

In the semiconductor light emitting element of Embodiment 3, the junction between the bonding layer 15 and the first p-side nitride semiconductor layer 13 is preferably a tunnel junction achieved by increasing the n-type impurity concentration of the bonding layer 15 and/or the p-type impurity concentration of the first p-side nitride semiconductor layer 13. Allowing the bonding layer 15 and the p-side nitride semiconductor 13 to have a tunnel junction can reduce the width of the depletion layer formed between the two, thereby allowing the electrical current to be effectively injected into the first active layer 12. This can also reduce the forward voltage.

In the method of manufacturing a semiconductor light emitting element of Embodiment 3, the second n-side nitride semiconductor layer provision step S2 is a step to provide a second light emitting part that includes a second n-side nitride semiconductor layer, a second p-side nitride semiconductor layer disposed on the face opposite the second bonding face of the second n-side nitride semiconductor layer, and a second active layer disposed between the second n-side nitride semiconductor layer and the second p-side nitride semiconductor layer. The second n-side nitride semiconductor layer provision step S2 includes, for example, the second n-side nitride semiconductor layer forming step S201, the second active layer forming step S202, and the second p-side nitride semiconductor layer forming step S203 shown in FIG. 3C to provide a second light emitting part 20.

Specifically, in the second n-side nitride semiconductor layer forming step S201, a second n-side nitride semiconductor layer 21 formed of a nitride semiconductor containing an n-type impurity is grown on a growth substrate formed of, for example, sapphire. Then in the second active layer forming step S202, a second active layer 22 is grown on the second n-side nitride semiconductor layer 21. In the second p-side nitride semiconductor layer forming step S203, a second p-side nitride semiconductor layer 23 is grown on the second active layer 22. After growing the second p-side nitride semiconductor layer 23, a resin layer and a support substrate are successively formed on the second p-side nitride semiconductor layer 23, followed by removing the growth substrate. The second n-side nitride semiconductor layer 21, the second active layer 22, and the second p-side nitride semiconductor layer 23 can be formed, for example, by MOCVD or PVD.

By subsequently performing the first bonding forming step S3, the second bonding face forming step S4, and the direct bonding step S5 in a similar manner as Embodiment 1, a semiconductor light emitting element of Embodiment 3 can be produced.

Similar to the explanation provided with reference to Embodiment 1, the second n-side nitride semiconductor layer 21 can include a bonding layer 15 to utilize the lower face of the bonding layer 15 as the second bonding face. In other words, the first bonding face 51 formed in the upper face of the first p-side nitride semiconductor layer 13 and the second bonding face 52 formed in the lower face of the boding layer 15 that is included in the second n-side nitride semiconductor layer 21 can be directly bonded.

Figure 3D:
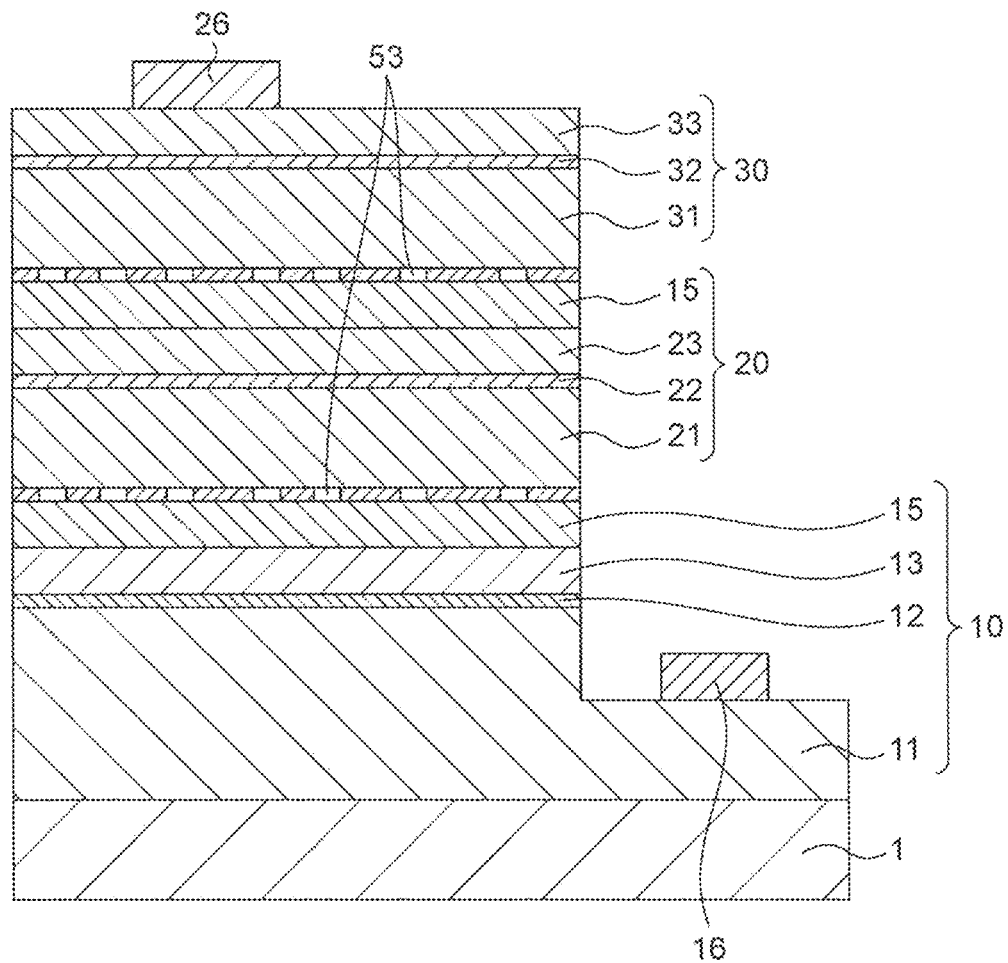
FIG. 3D is a cross-sectional view of a light emitting element variation of Embodiment 3.

As described above, for Embodiment 3, a semiconductor light emitting element in which the first light emitting part and the second light emitting part are directly bonded has been explained, but the semiconductor light emitting element can include additional constituents as described below. In other words, as shown in FIG. 3D, a third light emitting part 30 can further be disposed on the second light emitting part. The third light emitting part 30 may be grown by MOCVD or PVD, or disposed by the direct bonding method described earlier. Direct bonding, however, is preferable. This allows the first light emitting part 10, the second light emitting part 20, and the third light emitting part 30 to be provided by being grown separately on wafers, thereby reducing the thermal damage to the light emitting parts during the semiconductor growing step as compared to successively growing the first light emitting part 10, the second light emitting part 20, and the third light emitting part 30. In the case of directly bonding the third light emitting part 30 and the second light emitting part 20, the manufacturing method can include a step of providing a third light emitting part, which includes a third n-side nitride semiconductor layer 31, a third active layer 32, and a third p-side nitride semiconductor layer 33, a step of forming a third bonding face that extends in a third crystal plane by treating the third principal face of the second light emitting part 20 with an acidic or alkaline solution, a step of forming a fourth bonding face that extends in a fourth crystal plane having a plane orientation different from that of the third crystal plane by polishing the fourth principal face of the third n-side nitride semiconductor layer 31, and a step of directly bonding the third bonding face and the fourth bonding face.

The semiconductor light emitting element shown in FIG. 3D, includes the first light emitting part 10, the second light emitting part 20, and the third light emitting part 30. The third light emitting part 30 comprise a third n-side nitride semiconductor layer 31, a third p-side nitride semiconductor layer 33, and a third active layer 32 located between the third n-side nitride semiconductor layer 31 and the third p-side nitride semiconductor layer 32. A third bonding face of the second light emitting part 20 and a fourth bonding face of the third n-side nitride semiconductor layer 31 located on a side opposite the third p-side nitride semiconductor layer 33 are directly bonded. At least one void 53 is present between the third bonding face of the second light emitting part 20 and the fourth bonding face of the third n-side nitride semiconductor layer 31. Light can be efficiently extracted from the semiconductor light emitting element as the light is scattered by the voids 53. The third bonding face is located on a side opposite the second bonding face.

The second light emitting part 20 further includes a bonding layer 15 formed of a nitride semiconductor layer containing an n-type impurity and disposed on the second p-side nitride semiconductor layer 23. The upper face of the bonding layer 15 can be used as the third bonding face. In the case of this semiconductor light emitting element, the second light emitting part 20 and the third light emitting part 30 can be directly bonded after directly bonding the first light emitting part 10 and the second light emitting part 20, or the second light emitting part 20 and the first light emitting part 10 can be directly bonded after directly bonding the second light emitting part 20 and the third light emitting part 30. Voids 53 are interposed between the third bonding face and the fourth bonding face. The bonded part between the third bonding face of the second light emitting part 20 and the fourth bonding face of the third n-side nitride semiconductor layer 31 include third portions in which the third bonding face is directly bonded to the fourth bonding face, and fourth portions in which the third bonding face faces the fourth bonding face via the voids. Light can be efficiently extracted from the semiconductor light emitting element as the light is scattered by the voids 53. The light emitted by the first light emitting part 10, the second light emitting part 20, and the third light emitting part 30 can have peak wavelengths different from one another. For example, the semiconductor light emitting element can be made such that the light emitting part emits light having shorter wavelength as one is positioned closer to the light extraction face. For example, the first light emitting part 10, the second light emitting part 20, and the third light emitting part 30 can emit blue light, green light, and red light, respectively. By allowing a single semiconductor element to emit blue, green, and red light in this manner, white light can be extracted.

Embodiment 4

Figure 4A:
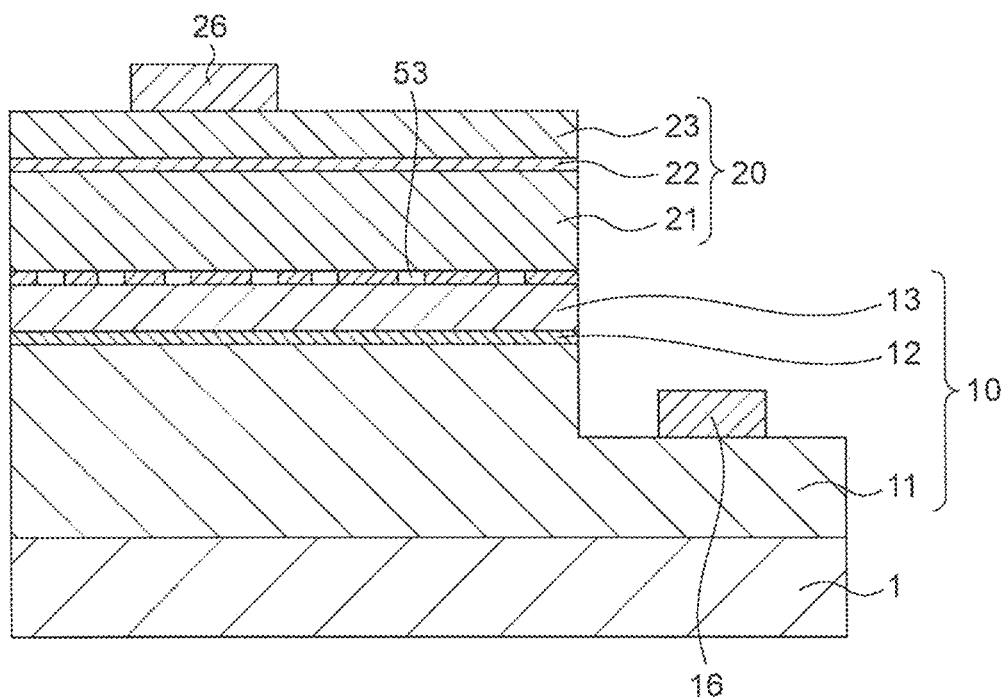
FIG. 4A is a cross-sectional view of a semiconductor light emitting element according to Embodiment 4.
Figure 4B:
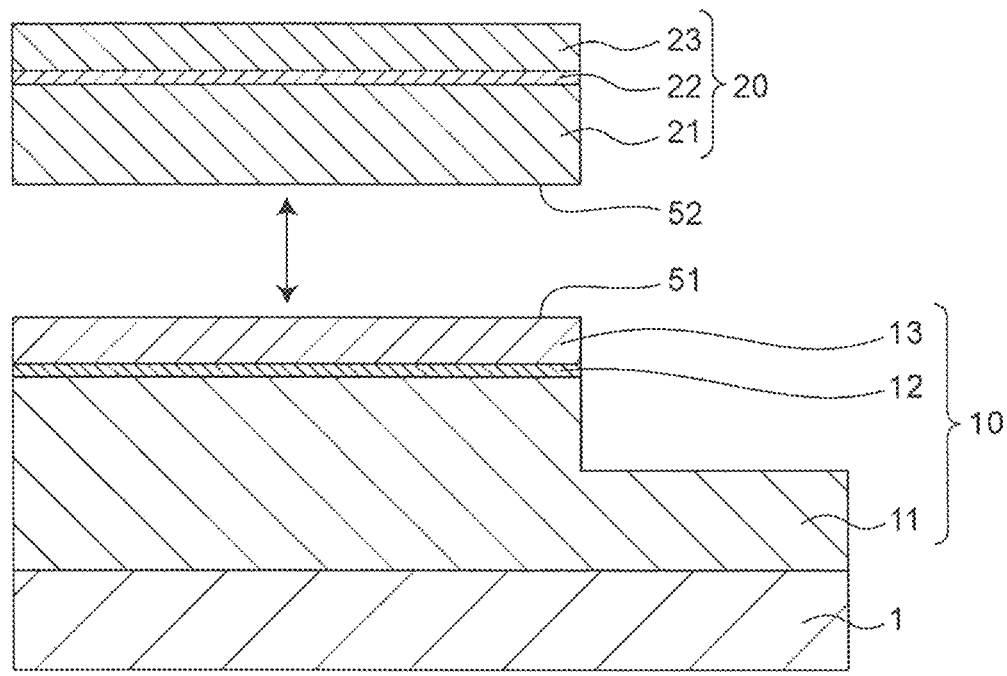
FIG. 4B is a cross-sectional view of the semiconductor light emitting element according to Embodiment 4 in which the directly bonded part is shown in a separated state.

FIG. 4A is a cross-sectional view of a semiconductor light emitting element according to Embodiment 4. FIG. 4B is a cross-sectional view in which the directly bonded part is shown in a separated state in order to make the directly bonded part easily understood. As shown in FIG. 4A, the semiconductor light emitting element of Embodiment 4 is constructed in a similar manner to the semiconductor light emitting element of Embodiment 3, except that the semiconductor light emitting element of Embodiment 4 does not include a bonding layer 15.

Specifically, in the case of a semiconductor light emitting element of Embodiment 4, the upper face of the first p-side nitride semiconductor layer 13 is the first bonding face 51, and the first bonding face 51 and the second bonding face 52 of the second n-side nitride semiconductor layer 21 are directly bonded. The bonding interface is formed between the first p-side nitride semiconductor layer 13 and the second n-side nitride semiconductor layer 21.

The semiconductor light emitting element of Embodiment 4 as constructed above has, at the bonded part between the first bonding face 51 of the first p-side nitride semiconductor layer 13 and the second bonding face 52 of the second n-side nitride semiconductor layer 21, portions in which the first bonding face 51 is directly bonded to the second bonding face 52, and portions in which the first bonding face 51 faces the second bonding face 52 via voids 53. In this manner, the semiconductor light emitting element of Embodiment 4 can achieve a similar effect to that of the semiconductor light emitting element of Embodiment 3.

Embodiment 5

Figure 5A:
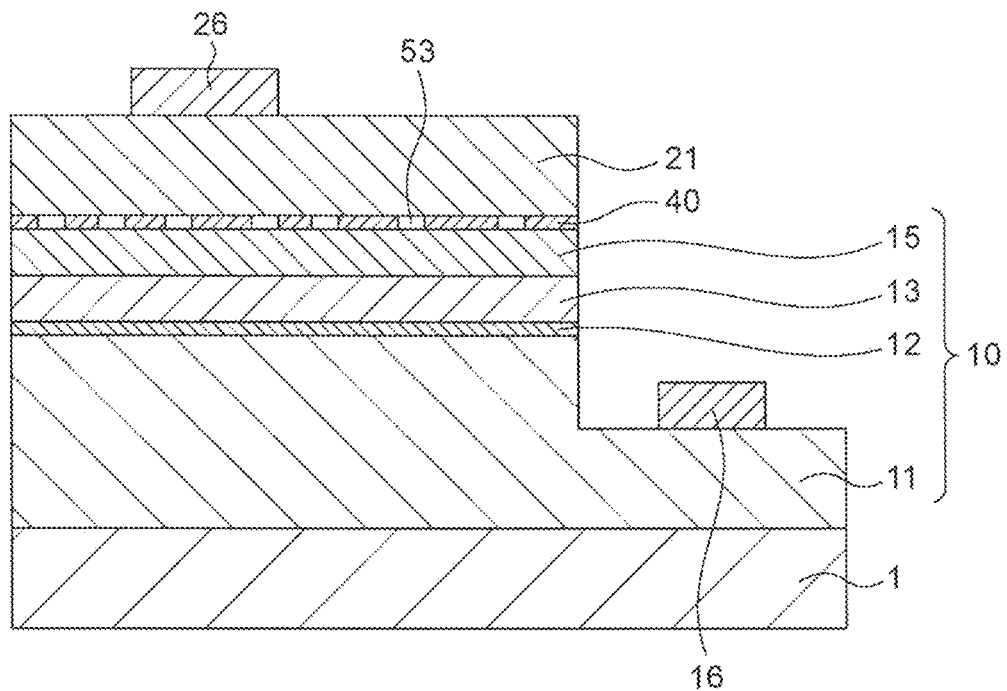
FIG. 5A is a cross-sectional view of a semiconductor light emitting element according to Embodiment 5.
Figure 5B:
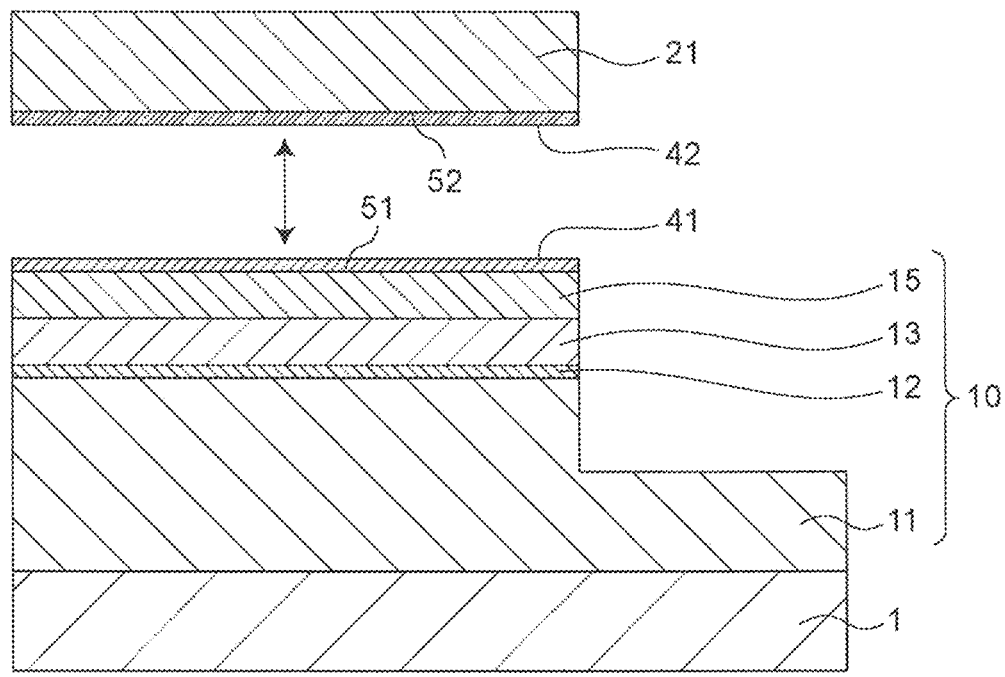
FIG. 5B is a cross-sectional view of the semiconductor light emitting element according to Embodiment 5 in which the directly bonded part is shown in a separated state.

FIG. 5A is a cross-sectional view of a semiconductor light emitting element of Embodiment 5. FIG. 5B is a cross-sectional view in which the directly bonded part is shown in a separated state in order to make the directly bonded part easily understood. As shown in FIG. 5A, the semiconductor light emitting element of Embodiment 5 is constructed in a similar manner to the semiconductor light emitting element of Embodiment 1, except that, in the semiconductor light emitting element of Embodiment 5, the first bonding face 51 and the second bonding face 52 are directly bonded via a metal layer 40.

Specifically, the semiconductor light emitting element of Embodiment 5 differs from the semiconductor light emitting element of Embodiment 1 such that a first metal layer 41 and a second metal layer 42 are disposed on the first bonding face 51 of the bonding layer 15 and the second bonding face 52 of the second n-side nitride semiconductor layer 21, respectively, and the first metal layer 41 and the second metal layer 42 are directly bonded by atomic diffusion bonding. The materials that can be used for the first metal layer 41 and the second metal layer 42 include, for example, aluminum, titanium, and gold. The first metal layer 41 and the second metal layer 42 may be formed of the same material or different materials. The thicknesses of the first metal layer 41 and the second metal layer 42 can be, for example, 0.2 nm to 5 nm, preferably 0.4 nm to 2 nm. This can reduce the absorption of the light from the first light emitting part while maintaining the bonding strength.

The semiconductor light emitting element of Embodiment 5 as constructed above has, at the bonded part between the first bonding face 51 of the first light emitting part 10 and the second bonding face 52 of the second n-side nitride semiconductor layer 21, first portions in which the first bonding face 51 is directly bonded to the second bonding face 52 via the metal layer 40, and second portions in which the first bonding face 51 faces the second bonding face 52 via voids 53. This allows the bonded part to efficiently scatter the light emitted by the first active layer 12 to be efficiently extracted from the semiconductor light emitting element.

Moreover, in a similar manner as Embodiment 3 or Embodiment 4, a second light emitting part 20 that includes a second n-side nitride semiconductor layer 21, a second active layer 22 disposed on the second n-side nitride semiconductor layer 21, and a second p-side nitride semiconductor layer 23 disposed on the second active layer 22 can be provided to directly bond the first bonding face 51 of the first light emitting part and the second bonding face 52 of the second n-side nitride semiconductor layer 21.

Light Emitting Device

Figure 6:
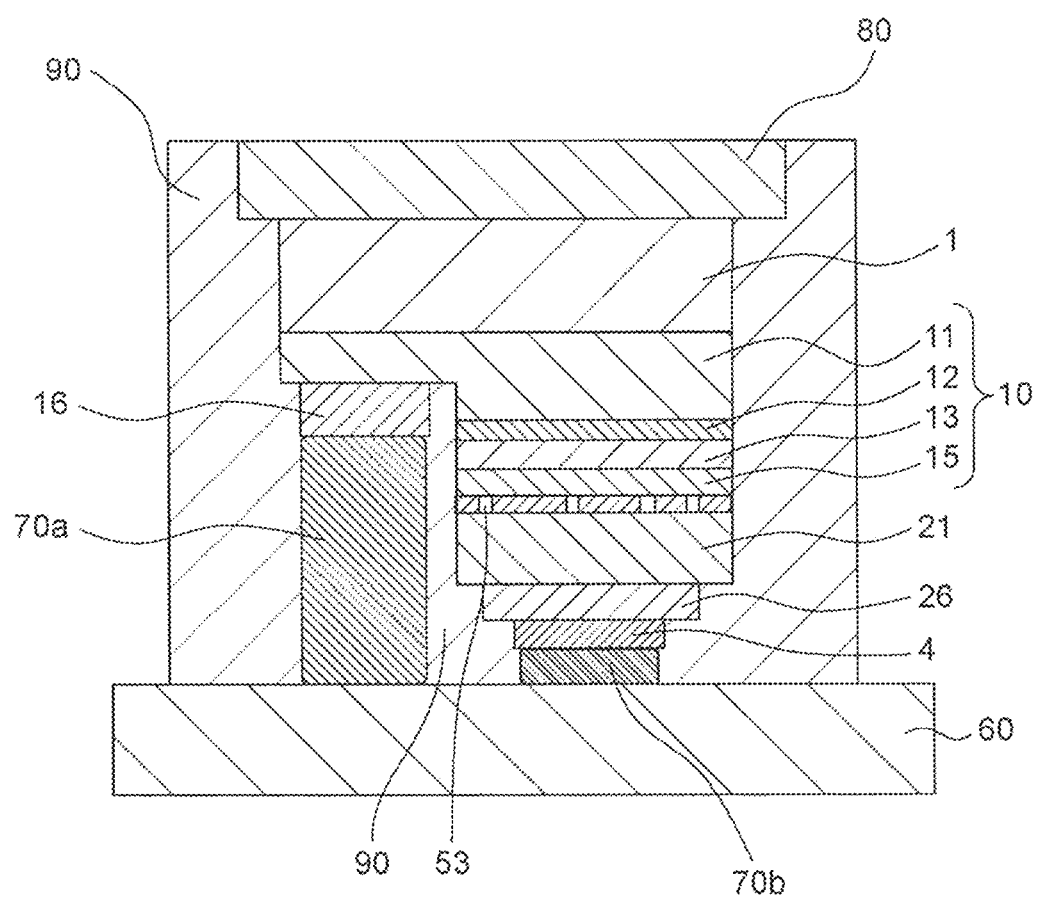
FIG. 6 is a cross-sectional view of a light emitting device including a semiconductor light emitting element according to an embodiment of the present disclosure.

FIG. 6 is a cross-sectional view of a light emitting device equipped with a semiconductor light emitting element according to an embodiment of the present disclosure.

The semiconductor light emitting element of the embodiment described above is flip chip mounted on a wiring electrode or the like formed on the mounting substrate 60. The element is flip chip mounted by connecting the wiring electrode formed on the mounting substrate 60 to the electrode 16 and the electrode 26 by using connection members 70a and 70b. The connection members 70a and 70b can be formed of bumps, plating, or the like. On the substrate 1, a wavelength conversion member 80 can be disposed. For the wavelength conversion member 80, for example, a sintered body containing a phosphor can be used. A resin layer 90 having light reflectivity is formed to cover the lateral faces of the semiconductor light emitting element and the wavelength conversion member 80. The first light emitting part 10 and the second n-side nitride semiconductor layer 21 are exposed at the lateral faces of the semiconductor light emitting element, but as a light emitting device, the lateral faces of the first light emitting part 10 and the second n-side nitride semiconductor layer 21 are covered by the resin layer 90. The resin layer 90 contains particles having a different refractive index from that of the resin making up the resin layer 90. For such particles, aluminum oxide, titanium oxide, or the like can be used. The light from the semiconductor light emitting element is primarily extracted from the upper face of the wavelength conversion member 80 exposed from the resin layer 90. A portion of the light from the semiconductor light emitting element is scattered by the voids 53 and extracted from the upper face of the wavelength conversion member 80. The conductive layer 4 includes a metal film, such as Ag or Al, and can reflect the light from the semiconductor light emitting element. At this time, a portion of the outgoing light from the first light emitting part 10 that advances towards the mounting substrate 60 is reflected by at least one of the conductive layer 4, the electrodes 16 and 26, the resin layer 90, and the connection members 70a and 70b towards the wavelength conversion member 80. A light emitting device that employs a light emitting element of Embodiment 1 has been illustrated, but is not limited to this. A light emitting device can be constructed by using a light emitting element in which a first light emitting part 10 is directly bonded to the second light emitting part 20 described earlier. In this case, the wavelength conversion member 80 may be disposed or not.

EXAMPLES

Example 1

In Example 1, a semiconductor light emitting element of Embodiment 3 shown in FIG. 3A was produced.

In Example 1, a first n-side nitride semiconductor layer 11 was formed by growing an undoped GaN layer to a thickness of 3 μm on the c-plane of a sapphire substrate 1 via a 20 nm thick AlGaN buffer layer, followed by growing an n-type GaN layer containing Si at an n-type impurity concentration of $6\times10^{18}/cm^3$ to a thickness of 7 μm.

Then a first active layer 12 was grown by stacking on the first n-side nitride semiconductor layer 11 nine pairs of a 5 nm thick undoped GaN barrier layer and a 3.5 nm thick undoped $In_xGa_{1-x}N$ (x=0.14) well layer alternately.

Subsequently, on the first active layer 12, a first p-side nitride semiconductor layer 13 was formed by successively growing a 10 nm thick Mg doped AlGaN layer, a 70 nm thick undoped GaN layer, and a 20 nm thick Mg doped GaN layer.

Furthermore, on the first p-side nitride semiconductor layer 13, a bonding layer 15 was formed by growing a 120 nm thick n-type GaN layer having a Si (as an n-type impurity) concentration of $2 \times 10^{20}/cm^3$ by MBE.

By following the steps described above, a first light emitting part 10 in which the surface of the bonding layer 15, the bonding face, is a +c-plane was provided.

Subsequently, on the +c-plane of a sapphire growth substrate 101, a second n-side nitride semiconductor layer 21 was grown in a similar manner as the first n-side nitride semiconductor layer 11.

Then on the second n-side nitride semiconductor layer 21, a second active layer 22 was grown in a similar manner as the first active layer 12.

Subsequently, on the second active layer 22, a second p-side nitride semiconductor layer 23 was grown in a similar manner as the first p-side nitride semiconductor layer 13.

Then on the second p-side nitride semiconductor layer 23, a support substrate formed of sapphire was bonded via a polyimide resin adhesive, and the sapphire growth substrate 101 was removed.

In the manner described above, a second light emitting part 20 in which the surface of the second n-side nitride semiconductor layer 21, the bonding face, is a −c-plane was provided.

Subsequently, the surface of the bonding layer 15 of the first light emitting part 10 was dipped and cleaned in TMAH at 70° C. for 20 minutes to obtain a first bonding face 51.

Subsequently, the surface of the second n-side nitride semiconductor layer 21 of the second light emitting part 20 was flattened by CMP, by using a pad while dripping a slurry made by mixing silica particles in a KOH solution to obtain a second bonding face 52.

Then both the first bonding face 51 of the bonding layer 15 of the first light emitting part 10 and the second bonding face 52 of the second n-side nitride semiconductor layer 21 of the second light emitting part 20 were irradiated with high-speed ion beams for 30 seconds in a vacuum chamber. Subsequently, the first bonding face and the second bonding face were bonded by surface activated bonding in the same chamber under 100 MPa pressure.

After etching off a portion of the second light emitting part 20 and a portion of the first light emitting part 10 from the second light emitting part 20 side to the substrate 1 to expose a portion of the surface of the first n-side nitride semiconductor layer 11, an n-electrode was formed on the exposed surface, and a p-electrode was formed on the surface of the second p-side nitride semiconductor layer 23.

When the bonding interface between the bonding layer 15 and the second n-side nitride semiconductor layer 21 in the semiconductor light emitting element of Example 1 as produced above was checked by using a transmission electron microscope (TEM), the presence of voids 53 of a few nanometers in size were confirmed. By observing a TEM image of a cross section of the semiconductor light emitting element, the long diameter lengths of the voids observed between the first bonding face 51 and the second bonding face 52 within the range of 660 μm along the bonding interface were measured. The maximum length of the voids was estimated as 30 nm.

Figure 7A:
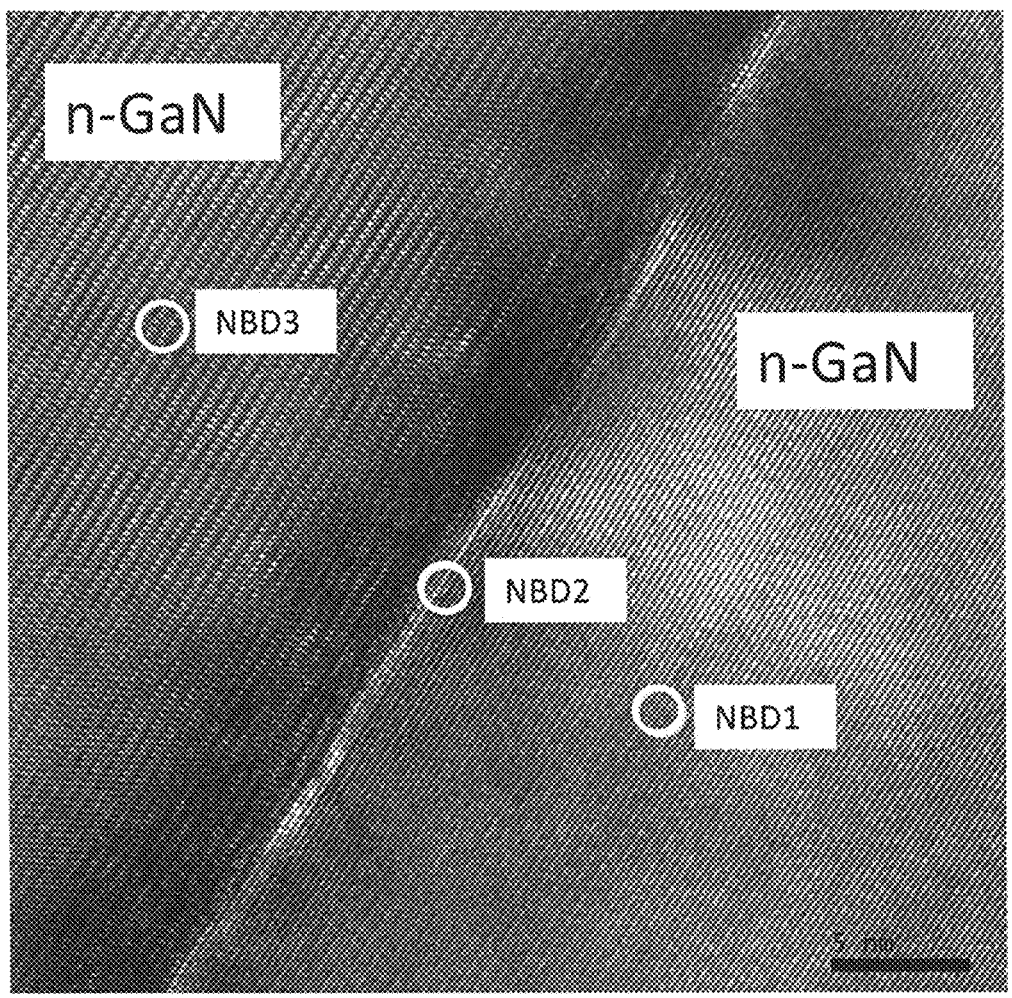
FIG. 7A is a transmission electron microscope (TEM) image of the bonding interface between the bonding layer and the second n-side nitride semiconductor layer and the vicinity thereof in the semiconductor light emitting element of Example 1.
Figure 7B:
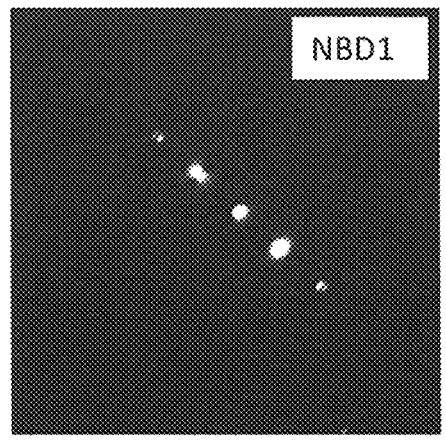
FIG. 7B is an electron diffraction image at NBD1 in FIG. 7A.
Figure 7C:
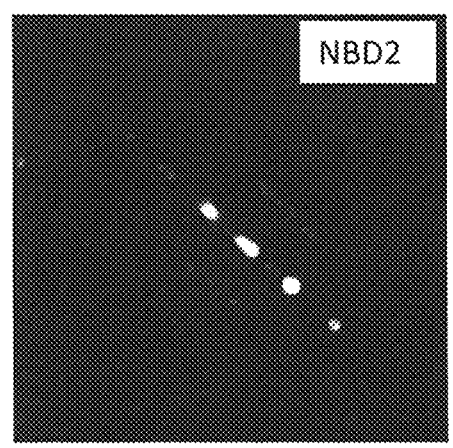
FIG. 7C is an electron diffraction image at NBD2 in FIG. 7A.
Figure 7D:
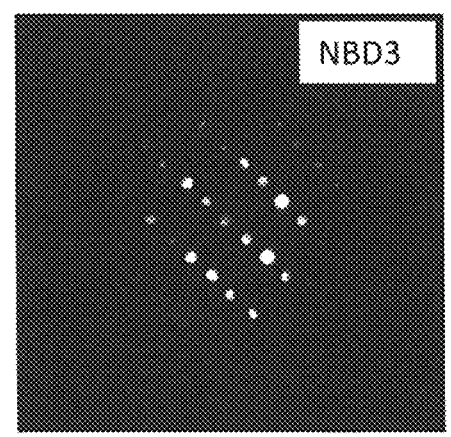
FIG. 7D is an electron diffraction image at NBD3 in FIG. 7A.

A TEM analysis was conducted on the semiconductor light emitting element of Example 1 as produced above. FIG. 7A is an image of the bonding interface between the bonding layer 15 and the second n-side nitride semiconductor layer 21 and the vicinity thereof. FIG. 7B shows an electron diffraction image at the measured location NBD1 indicated in FIG. 7A. FIG. 7C shows an electron diffraction image at the measured location NBD2 indicated in FIG. 7A. FIG. 7D shows an electron diffraction image at the measured location NBD3 indicated in FIG. 7A. As shown in FIG. 7A to FIG. 7D, diffraction spots were observed at the bonding interface and in the vicinity of the interface. From FIG. 7A, moreover, a direct connection of the atomic arrangements between the bonding layer 15 and the second n-side nitride semiconductor layer 21 was confirmed. FIG. 7B to FIG. 7D are nano beam electron diffraction (NBD) results.

Furthermore, in order to confirm that the output was increased by the voids 53 formed at the bonding interface, a semiconductor light emitting element without voids at the bonding interface was produced as a comparative example, and the output (i.e., emission intensity) of the two were compared.

The comparative semiconductor light emitting element was provided by continuously growing the semiconductor layers of the same composition as that of Example 1 on the substrate 1 by MOCVD. In other words, the comparative semiconductor light emitting element is the same as the semiconductor light emitting element of Embodiment 1 except for not including a bonding interface because the first light emitting part that includes a layer corresponding to the bonding layer 15 and the second light emitting part of Example 1 were continuously grown.

Moreover, a first reference semiconductor light emitting element and a second reference semiconductor light emitting element were produced to be used as a reference in the output comparison.

The first reference semiconductor light emitting element differs from the semiconductor light emitting element of Example 1 in not including a bonding layer 15 and a second light emitting part 20. The second reference semiconductor light emitting element differs from the comparative semiconductor light emitting element in not including a layer corresponding to the bonding layer 15 and the second light emitting part 20 of Example 1.

The outputs of the semiconductor light emitting element of Example 1, the comparative semiconductor light emitting element, the first reference semiconductor light emitting element, and the second reference semiconductor light emitting element were measured by varying the value of the electric current applied.

Figure 8:
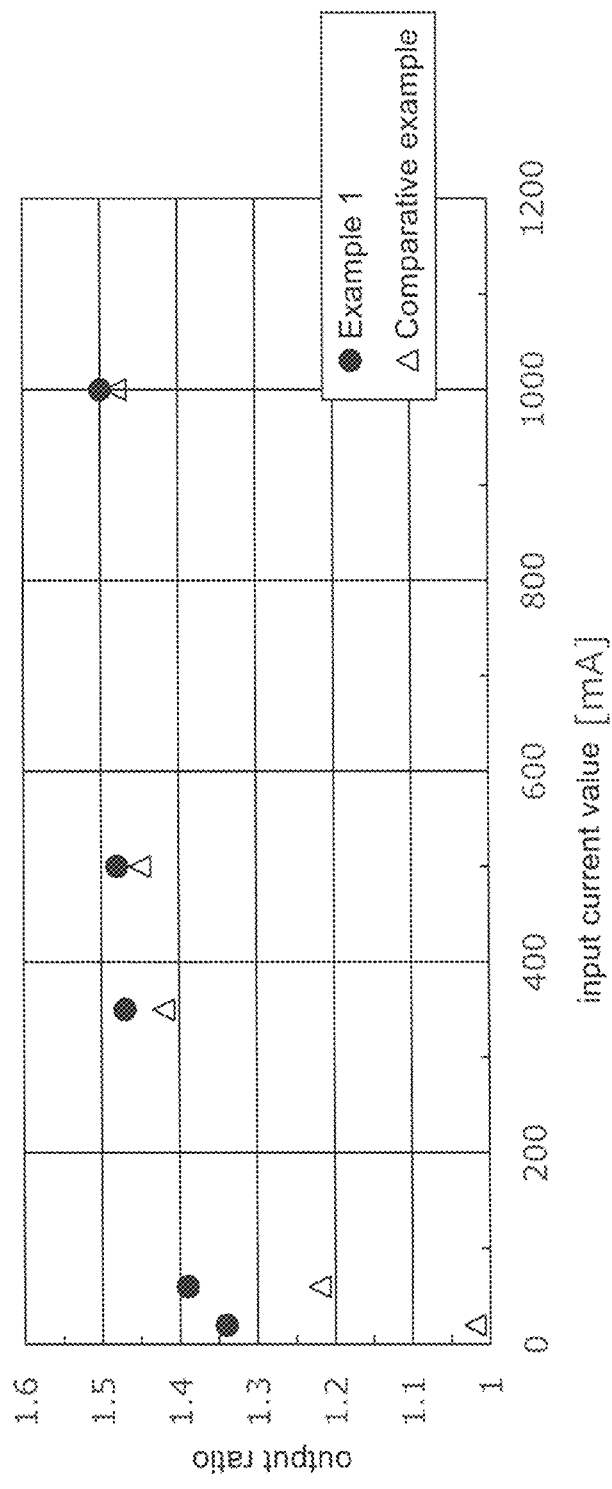
FIG. 8 is a graph showing the output ratios of the semiconductor light emitting element of Example 1 and the output ratios of a comparative semiconductor light emitting element.

FIG. 8 shows the output measurement results.

Here, after each of the light emitting elements that had been divided into individual pieces were mounted in a lamp type package, the outputs were measured using an integrating sphere.

In the graph in FIG. 8, the outputs are shown as the output ratios to the outputs (mW) of the reference semiconductor light emitting elements, which is 1 as a reference output in each case, at input current values of 20 mA, 60 mA, 350 mA, 500 mA, and 1000 mA. In FIG. 8, the black plots represent the output ratios of the semiconductor light emitting element of Example 1, and white plots represent the output ratios of the comparative semiconductor light emitting element.

As shown in FIG. 8, the semiconductor light emitting element of Example 1, which included a bonding interface having voids 53, was confirmed to achieve higher outputs than the comparative semiconductor light emitting element that included no bonding interface.

Example 2

In Example 2, a semiconductor light emitting element of Embodiment 2 shown in FIG. 2A was produced.

In Example 2, similar to Example 1, a first n-side nitride semiconductor layer 11, a first active layer 12, and a first p-side nitride semiconductor layer 13 were formed on the c-plane of a sapphire substrate 1.

As described above, a first light emitting part 10 in which the surface of the first A-side nitride semiconductor layer 13, the bonding face, is a +c-plane was formed.

Subsequently, a second n-side nitride semiconductor layer 21 was grown on the c-plane of the sapphire substrate 1 in a similar manner as Example 1.

Then on the second n-side nitride semiconductor layer 21, the same support substrate as that used in Example 1 was bonded via the same adhesive as that used in Example 1, and the sapphire substrate 1 was removed.

In the manner described above, a second n-side nitride semiconductor layer 21 in which the surface serving as the bonding face is a −c-plane was provided.

Subsequently, the surface of the first p-side nitride semiconductor layer 13 of the first light emitting part 10 was treated and cleaned in a similar manner as Example 1 to obtain a first bonding face 51.

Subsequently, the surface of the second n-side nitride semiconductor layer 21 was flattened by CMP in a similar manner as Example 1 to obtain a second bonding face 52.

Then the first bonding face 51 of the first p-side nitride semiconductor layer 13 of the first light emitting part 10 and the second bonding face 52 of the second n-side nitride semiconductor layer 21 were directly bonded by surface activated bonding under similar conditions as Example 1.

After removing the support substrate and etching off a portion of the second n-side nitride semiconductor layer 21 and a portion of the first light emitting part 10 from the second nitride semiconductor layer 21 to the substrate 1 to expose a portion of the surface of the first n-side nitride semiconductor layer 11, an n-electrode was formed on the surface, and a p-electrode was formed on the surface of the second p-side nitride semiconductor layer 23.

When the bonding interface between the first p-side nitride semiconductor layer 13 and the second n-side nitride semiconductor layer 21 in the semiconductor light emitting element of Example 2 as produced above was checked by using a scanning electron microscope, the presence of voids 53 were confirmed.

Figure 9A:
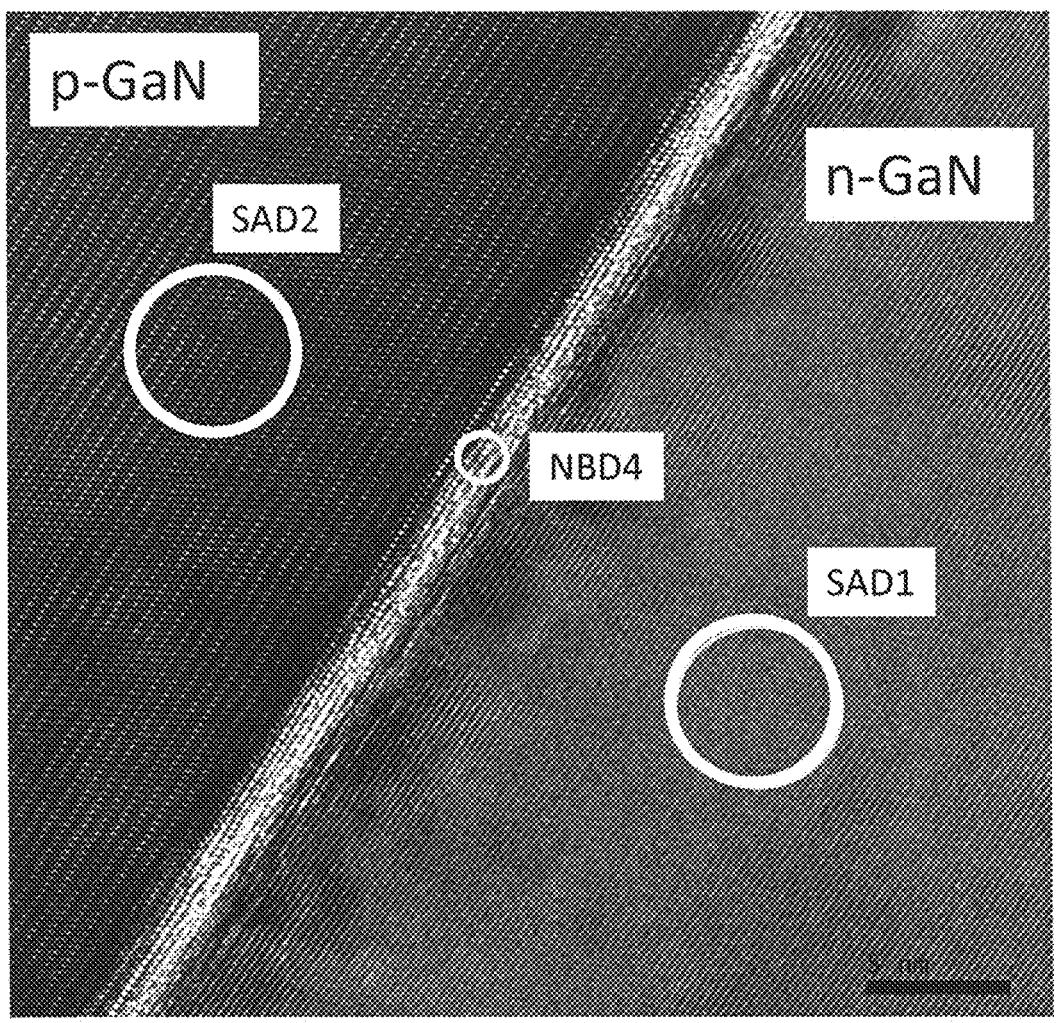
FIG. 9A is a transmission electron microscope (TEM) image of the bonding interface and the vicinity thereof in the semiconductor light emitting element of Example 2.
Figure 9B:
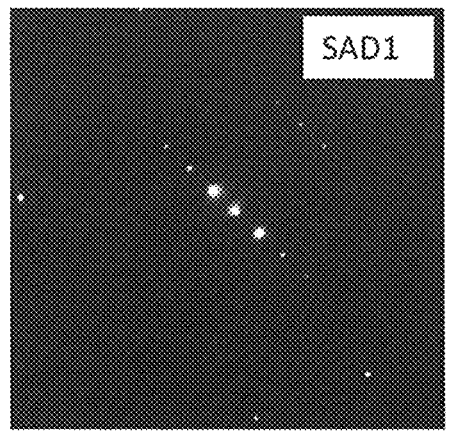
FIG. 9B is an electron diffraction image at SAD1 in FIG. 9A.
Figure 9C:
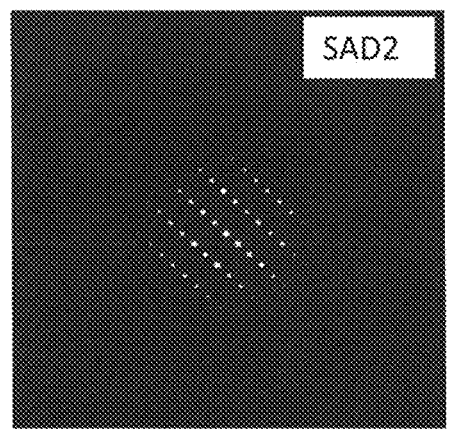
FIG. 9C is an electron diffraction image at SAD2 in FIG. 9A.
Figure 9D:
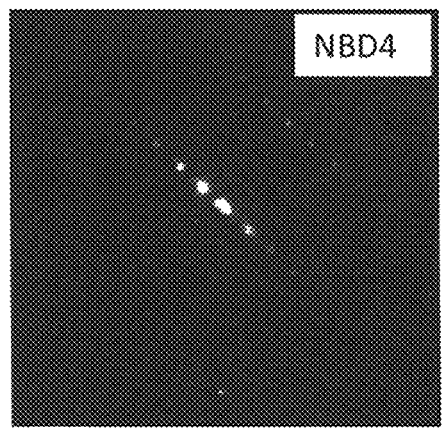
FIG. 9D is an electron diffraction image at NBD4 in FIG. 9A.

A TEM analysis of the semiconductor light emitting element of Example 2 as produced above was conducted. FIG. 9A is an image of the bonding interface between the first p-side nitride semiconductor layer 13 and the second n-side nitride semiconductor layer 21 and the vicinity thereof. FIG. 9B is an electron diffraction image at the measured location SAD1 indicated in FIG. 9A. FIG. 9C is an electron diffraction image at the measured location SAD2 indicated in FIG. 9A. FIG. 9D is an electron diffraction image at the measured location NBD4 indicated in FIG. 9A. FIG. 9B and FIG. 9C are selected area electron diffraction (SAD) results, and FIG. 9D is an NBD result.

As shown in FIG. 9A to FIG. 9D, diffraction spots were observed at the bonding interface and in the vicinity of the interface. From FIG. 9A, the direct connection of the atomic arrangements between the first p-side nitride semiconductor layer 13 and the second n-side nitride semiconductor layer 21 was confirmed.

Figure 10A:
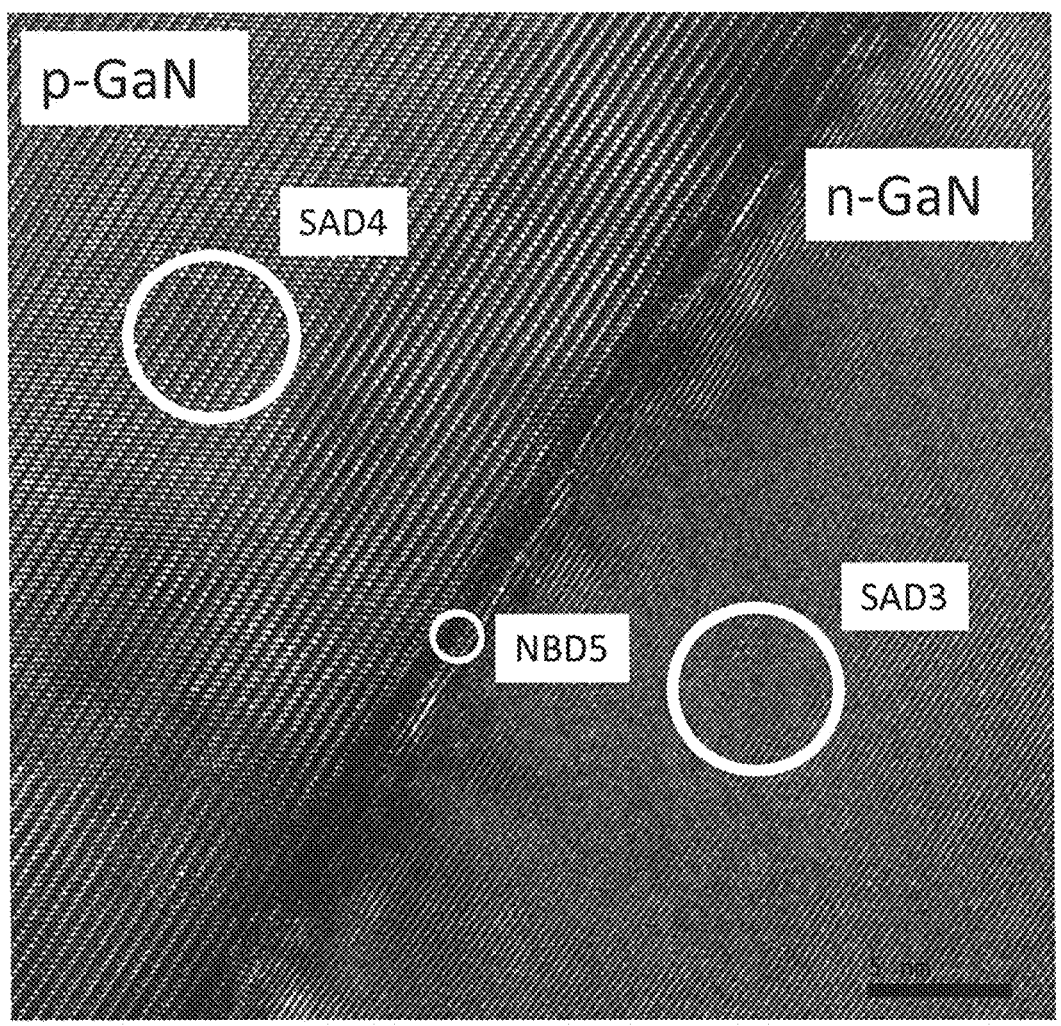
FIG. 10A is a transmission electron microscope (TEM) image of the bonding interface and the vicinity thereof in the semiconductor light emitting element of Example 2 after annealing.
Figure 10B:
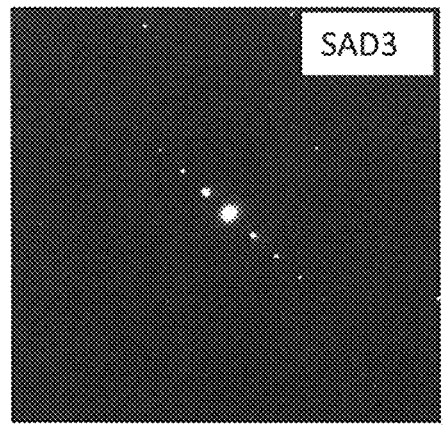
FIG. 10B is an electron diffraction image at SAD3 in FIG. 10A.
Figure 10C:
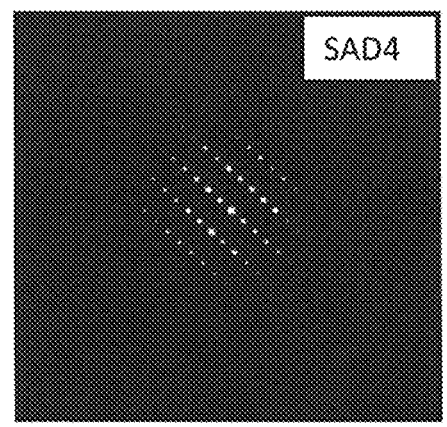
FIG. 10C is an electron diffraction image at SAD4 in FIG. 10A.
Figure 10D:
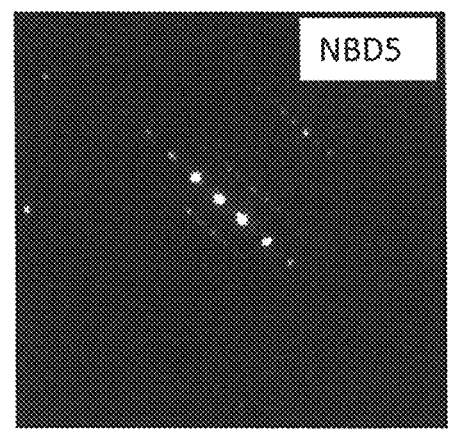
FIG. 10D is an electron diffraction image at NBD5 in FIG. 10A.

A semiconductor light emitting element produced under similar conditions as Example 2 was bonded under similar conditions as Example 2, and annealed at 700° C. A TEM analysis was conducted on this annealed semiconductor light emitting element. FIG. 10A is a TEM image of the bonding interface and the vicinity thereof. FIG. 10B is an electron diffraction image at the measured location SAD3 indicated in FIG. 10A. FIG. 10C is an electron diffraction image at the measured location SAD4 indicated in FIG. 10A. FIG. 10D is an electron diffraction image at the measured location NBD5 indicated in FIG. 10A. FIG. 10B and FIG. 10C are SAD results, and FIG. 10D is an NBD result.

As shown in FIG. 10A to FIG. 10D, diffraction spots were observed at the bonding interface and in the vicinity of the interface. From FIG. 10A, the direct connection of atomic arrangements between the first p-side nitride semiconductor layer 13 and the second n-side nitride semiconductor layer 21 was confirmed.

Comparing FIG. 9A and FIG. 10A, the contrast at the bonding interface that includes NBD5 and the vicinity of the bonding interface that includes SAD3 and SAD4 in FIG. 10A is lower than the contrast at the bonding interface that includes NBD4 and the vicinity of the bonding interface that includes SAD 1 and SAD 2 in FIG. 9A.

From the results described above, it is believed that the crystallinity in the vicinity of the bonding interface was improved by annealing the semiconductor element after directly bonding the first light emitting part and the second n-side nitride semiconductor layer.

What is claimed is:

1. A semiconductor light emitting element comprising:
    a first light emitting part comprising:
        a first n-side nitride semiconductor layer;
        a first active layer located on the first n-side nitride semiconductor layer; and
        a first p-side nitride semiconductor layer located on the first active layer; and
    a second n-side nitride semiconductor layer; wherein:
    a bonding face of the first light emitting part and a bonding face of the second n-side nitride semiconductor layer are directly bonded; and
    at least one void is present between the bonding face of the first light emitting part and the bonding face of the second n-side nitride semiconductor layer, wherein a maximum length of the at least one void is 50 nm or less.

2. The semiconductor light emitting element according to claim 1, comprising:
    a second light emitting part comprising:
        the second n-side nitride semiconductor layer,
        a second p-side nitride semiconductor layer located on a side opposite the bonding face of the second n-side nitride semiconductor layer, and
        a second active layer located between the second n-side nitride semiconductor layer and the second p-side nitride semiconductor layer.

3. The semiconductor light emitting element according to claim 2, wherein:
    a peak wavelength of light emitted from the first light emitting part is different from a peak wavelength of light emitted from the second light emitting part.

4. The semiconductor light emitting element according to claim 1, wherein:
    the first light emitting part comprises a bonding layer that is formed of a nitride semiconductor containing an n-type impurity and is located on the first p-side nitride semiconductor layer; and
    the bonding face of the first light emitting part is an upper face of the bonding layer.

5. The semiconductor light emitting element according to claim 2, wherein:

the first light emitting part comprises a bonding layer that is formed of a nitride semiconductor containing an n-type impurity and is located on the first p-side nitride semiconductor layer; and the bonding face of the first light emitting part is an upper face of the bonding layer.

6. The semiconductor light emitting element according to claim 4, wherein:

an n-type impurity concentration of the bonding layer is higher than an n-type impurity concentration of the second n-side nitride semiconductor layer.

7. The semiconductor light emitting element according to claim 1, wherein:

a bonding interface between the first light emitting part and the second n-side nitride semiconductor layer comprises a single crystal region.

8. The semiconductor light emitting element according to claim 2 further comprising:

a third light emitting part comprising:
a third n-side nitride semiconductor layer,
a third p-side nitride semiconductor layer, and
a third active layer located between the third n-side nitride semiconductor layer and the third p-side nitride semiconductor layer; wherein:

a bonding face of the second light emitting part and a bonding face of the third n-side nitride semiconductor layer located on a side opposite the third p-side nitride semiconductor layer are directly bonded; and at least one void is present between the bonding face of the second light emitting part and the bonding face of the third n-side nitride semiconductor layer.

* * * * *